United States Patent
Cadugan et al.

(10) Patent No.: US 11,061,084 B2
(45) Date of Patent: Jul. 13, 2021

(54) COIL ACTUATED PRESSURE SENSOR AND DEFLECTABLE SUBSTRATE

(71) Applicant: Allegro MicroSystems, LLC, Manchester, NH (US)

(72) Inventors: Bryan Cadugan, Bedford, NH (US); Paul A. David, Bow, NH (US); Jason Boudreau, Exeter, NH (US); William P. Taylor, Amherst, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 250 days.

(21) Appl. No.: 16/295,131

(22) Filed: Mar. 7, 2019

(65) Prior Publication Data

US 2020/0284676 A1    Sep. 10, 2020

(51) Int. Cl.
*G01L 9/00* (2006.01)
*G01R 33/00* (2006.01)
(Continued)

(52) U.S. Cl.
CPC .......... *G01R 33/072* (2013.01); *G01L 13/025* (2013.01); *G01R 33/0005* (2013.01); *G01L 9/007* (2013.01)

(58) Field of Classification Search
CPC ................ G01R 33/00; G01R 33/0005; G01R 33/0011; G01R 33/0017; G01R 33/0094; G01R 33/0035; G01R 33/025; G01R 33/07; G01R 33/09; G01R 33/093; G01L 9/007; G01L 13/025
See application file for complete search history.

(56) References Cited

U.S. PATENT DOCUMENTS

| 3,132,337 A | 5/1964 | Martin |
| 3,195,043 A | 7/1965 | Burig et al. |

(Continued)

FOREIGN PATENT DOCUMENTS

| CH | 683 469 A5 | 3/1994 |
| DE | 25 18 054 | 11/1976 |

(Continued)

OTHER PUBLICATIONS

Response to Chinese Office Action with English translation filed on Apr. 14, 2021 for Chinese Application No. 201880034816.2; 10 pages.

(Continued)

*Primary Examiner* — John Fitzgerald
*Assistant Examiner* — Truong D Phan
(74) *Attorney, Agent, or Firm* — Daly, Crowley, Mofford & Durkee, LLP

(57) ABSTRACT

A pressure sensor includes a conductive substrate having a cavity which forms a thin portion that can be deformed by a pressure differential. A magnetic field sensor has at least one coil responsive to a changing coil drive signal and positioned proximate to the thin portion of the substrate that induces eddy currents in the thin portion that generate a reflected magnetic field. Magnetic field sensing elements detect the reflected magnetic field and generate a magnetic field signal. The magnetic field sensor is positioned so that deformation of the thin portion of the substrate causes a distance between the thin portion of the substrate and the magnetic field sensor to change.

23 Claims, 7 Drawing Sheets

(51) Int. Cl.
*G01R 33/07* (2006.01)
*G01L 13/02* (2006.01)

(56) References Cited

U.S. PATENT DOCUMENTS

| | | | |
|---|---|---|---|
| 3,281,628 A | 10/1966 | Bauer et al. |
| 3,607,528 A | 9/1971 | Gassaway |
| 3,611,138 A | 10/1971 | Winebrener |
| 3,661,061 A | 5/1972 | Tokarz |
| 3,728,786 A | 4/1973 | Lucas et al. |
| 4,048,670 A | 9/1977 | Eysermans |
| 4,188,605 A | 2/1980 | Stout |
| 4,204,317 A | 5/1980 | Winn |
| 4,236,832 A | 12/1980 | Komatsu et al. |
| 4,283,643 A | 8/1981 | Levin |
| 4,315,523 A | 2/1982 | Mahawili et al. |
| 4,438,347 A | 3/1984 | Gehring |
| 4,573,258 A | 3/1986 | Io et al. |
| 4,614,111 A | 9/1986 | Wolff |
| 4,649,796 A | 3/1987 | Schmidt |
| 4,670,715 A | 6/1987 | Fuzzell |
| 4,703,378 A | 10/1987 | Imakoshi et al. |
| 4,719,419 A | 1/1988 | Dawley |
| 4,733,455 A | 3/1988 | Nakamura et al. |
| 4,745,363 A | 5/1988 | Carr et al. |
| 4,746,859 A | 5/1988 | Malik |
| 4,752,733 A | 6/1988 | Petr et al. |
| 4,758,943 A | 7/1988 | Aström et al. |
| 4,760,285 A | 7/1988 | Nelson |
| 4,764,767 A | 8/1988 | Ichikawa et al. |
| 4,769,344 A | 9/1988 | Sakai et al. |
| 4,772,929 A | 9/1988 | Manchester |
| 4,789,826 A | 12/1988 | Willett |
| 4,796,354 A | 1/1989 | Yokoyama et al. |
| 4,823,075 A | 4/1989 | Alley |
| 4,833,406 A | 5/1989 | Foster |
| 4,893,027 A | 1/1990 | Kammerer et al. |
| 4,908,685 A | 3/1990 | Shibasaki et al. |
| 4,910,861 A | 3/1990 | Dohogne |
| 4,935,698 A | 6/1990 | Kawaji et al. |
| 4,944,028 A | 7/1990 | Iijima et al. |
| 4,954,777 A | 9/1990 | Klopfer et al. |
| 4,970,411 A | 11/1990 | Hälg et al. |
| 4,983,916 A | 1/1991 | Iijima et al. |
| 5,012,322 A | 4/1991 | Guillotte et al. |
| 5,021,493 A | 6/1991 | Sandstrom |
| 5,028,868 A | 7/1991 | Murata et al. |
| 5,045,920 A | 9/1991 | Vig et al. |
| 5,078,944 A | 1/1992 | Yoshino |
| 5,084,289 A | 1/1992 | Shin et al. |
| 5,121,289 A | 6/1992 | Gagliardi |
| 5,137,677 A | 8/1992 | Murata |
| 5,139,973 A | 8/1992 | Nagy et al. |
| 5,167,896 A | 12/1992 | Hirota et al. |
| 5,185,919 A | 2/1993 | Hickey |
| 5,196,794 A | 3/1993 | Murata |
| 5,200,698 A | 4/1993 | Thibaud |
| 5,210,493 A | 5/1993 | Schroeder et al. |
| 5,216,405 A | 6/1993 | Schroeder et al. |
| 5,244,834 A | 9/1993 | Suzuki et al. |
| 5,247,202 A | 9/1993 | Popovic et al. |
| 5,247,278 A | 9/1993 | Pant et al. |
| 5,250,925 A | 10/1993 | Shinkle |
| 5,286,426 A | 2/1994 | Rano, Jr. et al. |
| 5,289,344 A | 2/1994 | Gagnon et al. |
| 5,315,245 A | 5/1994 | Schroeder et al. |
| 5,329,416 A | 7/1994 | Ushiyama et al. |
| 5,332,956 A | 7/1994 | Oh |
| 5,332,965 A | 7/1994 | Wolf et al. |
| 5,399,968 A | 3/1995 | Sheppard et al. |
| 5,412,255 A | 5/1995 | Wallrafen |
| 5,414,355 A | 5/1995 | Davidson et al. |
| 5,424,558 A | 6/1995 | Borden et al. |
| 5,432,444 A | 7/1995 | Yasohama et al. |
| 5,434,105 A | 7/1995 | Liou |
| 5,453,727 A | 9/1995 | Shibasaki et al. |
| 5,469,058 A | 11/1995 | Dunnam |
| 5,479,695 A | 1/1996 | Grader et al. |
| 5,486,759 A | 1/1996 | Seiler et al. |
| 5,488,294 A | 1/1996 | Liddell et al. |
| 5,491,633 A | 2/1996 | Henry et al. |
| 5,497,081 A | 3/1996 | Wolf et al. |
| 5,500,589 A | 3/1996 | Sumcad |
| 5,500,994 A | 3/1996 | Itaya |
| 5,508,611 A | 4/1996 | Schroeder et al. |
| 5,521,501 A | 5/1996 | Dettmann et al. |
| 5,545,983 A | 8/1996 | Okeya et al. |
| 5,551,146 A | 9/1996 | Kawabata et al. |
| 5,581,170 A | 12/1996 | Mammano et al. |
| 5,581,179 A | 12/1996 | Engel et al. |
| 5,596,272 A | 1/1997 | Busch |
| 5,621,319 A | 4/1997 | Bilotti et al. |
| 5,627,315 A | 5/1997 | Figi et al. |
| 5,631,557 A | 5/1997 | Davidson |
| 5,640,090 A | 6/1997 | Furuya et al. |
| 5,691,637 A | 11/1997 | Oswald et al. |
| 5,696,790 A | 12/1997 | Graham et al. |
| 5,712,562 A | 1/1998 | Berg |
| 5,714,102 A | 2/1998 | Highum et al. |
| 5,719,496 A | 2/1998 | Wolf |
| 5,729,128 A | 3/1998 | Bunyer et al. |
| 5,757,181 A | 5/1998 | Wolf et al. |
| 5,781,005 A | 7/1998 | Vig et al. |
| 5,789,658 A | 8/1998 | Henn et al. |
| 5,789,915 A | 8/1998 | Ingraham |
| 5,796,249 A | 8/1998 | Andräet et al. |
| 5,798,462 A * | 8/1998 | Briefer .............. G01D 5/202 |
| | | 73/722 |
| 5,818,222 A | 10/1998 | Ramsden |
| 5,818,223 A | 10/1998 | Wolf |
| 5,839,185 A | 11/1998 | Smith et al. |
| 5,841,276 A | 11/1998 | Makino et al. |
| 5,859,387 A | 1/1999 | Gagnon |
| 5,883,567 A | 3/1999 | Mullins, Jr. |
| 5,886,070 A | 3/1999 | Honkura et al. |
| 5,896,030 A | 4/1999 | Hasken |
| 5,912,556 A | 6/1999 | Frazee et al. |
| 5,963,028 A | 10/1999 | Engel et al. |
| 6,011,770 A | 1/2000 | Tan |
| 6,016,055 A | 1/2000 | Jager et al. |
| 6,043,644 A | 3/2000 | de Coulon et al. |
| 6,043,646 A | 3/2000 | Jansseune |
| 6,064,198 A | 5/2000 | Wolf et al. |
| 6,136,250 A | 10/2000 | Brown |
| 6,169,396 B1 | 1/2001 | Yokotani et al. |
| 6,175,233 B1 | 1/2001 | McCurley et al. |
| 6,180,041 B1 | 1/2001 | Takizawa |
| 6,184,679 B1 | 2/2001 | Popovic et al. |
| 6,198,373 B1 | 3/2001 | Ogawa et al. |
| 6,242,604 B1 | 6/2001 | Hudlicky et al. |
| 6,242,904 B1 | 6/2001 | Shirai et al. |
| 6,242,905 B1 | 6/2001 | Draxelmayr |
| 6,265,865 B1 | 7/2001 | Engel et al. |
| 6,278,269 B1 | 8/2001 | Vig et al. |
| 6,297,627 B1 | 10/2001 | Towne et al. |
| 6,339,322 B1 | 1/2002 | Loreck et al. |
| 6,351,506 B1 | 2/2002 | Lewicki |
| 6,356,068 B1 | 3/2002 | Steiner et al. |
| 6,392,478 B1 | 5/2002 | Mulder et al. |
| 6,429,640 B1 | 8/2002 | Daughton et al. |
| 6,436,748 B1 | 8/2002 | Forbes et al. |
| 6,437,558 B2 | 8/2002 | Li et al. |
| 6,452,381 B1 | 9/2002 | Nakatani et al. |
| 6,462,536 B1 | 10/2002 | Mednikov et al. |
| 6,492,804 B2 | 12/2002 | Tsuge et al. |
| 6,501,270 B1 | 12/2002 | Opie |
| 6,504,363 B1 | 1/2003 | Dogaru et al. |
| 6,525,531 B2 | 2/2003 | Forrest et al. |
| 6,528,992 B2 | 3/2003 | Shinjo et al. |
| 6,542,847 B1 | 4/2003 | Lohberg et al. |
| 6,545,332 B2 | 4/2003 | Huang |
| 6,545,457 B2 | 4/2003 | Goto et al. |
| 6,545,462 B2 | 4/2003 | Schott et al. |
| 6,566,872 B1 | 5/2003 | Sugitani |

(56) References Cited

U.S. PATENT DOCUMENTS

| | | |
|---|---|---|
| 6,640,451 B1 | 11/2003 | Vinarcik |
| 6,653,968 B1 | 11/2003 | Schneider |
| 6,674,679 B1 | 1/2004 | Perner et al. |
| 6,687,644 B1 | 2/2004 | Zinke et al. |
| 6,692,676 B1 | 2/2004 | Dwyer et al. |
| 6,704,186 B2 | 3/2004 | Ishikura |
| 6,707,298 B2 | 3/2004 | Suzuki et al. |
| 6,759,843 B2 | 7/2004 | Furlong |
| 6,770,163 B1 | 8/2004 | Kuah et al. |
| 6,781,233 B2 | 8/2004 | Zverev et al. |
| 6,781,359 B2 | 8/2004 | Stauth et al. |
| 6,798,193 B2 | 9/2004 | Zimmerman et al. |
| 6,815,944 B2 | 11/2004 | Vig et al. |
| 6,822,443 B1 | 11/2004 | Dogaru |
| 6,853,178 B2 | 2/2005 | Hayat-Dawoodi |
| 6,896,407 B2 | 5/2005 | Nomiyama et al. |
| 6,902,951 B2 | 6/2005 | Goller et al. |
| 6,917,321 B1 | 7/2005 | Haurie et al. |
| 6,956,366 B2 | 10/2005 | Butzmann |
| 7,023,205 B1 | 4/2006 | Krupp |
| 7,026,808 B2 | 4/2006 | Vig et al. |
| 7,031,170 B2 | 4/2006 | Daeche et al. |
| 7,038,448 B2 | 5/2006 | Schott et al. |
| 7,049,924 B2 | 5/2006 | Hayashi et al. |
| 7,112,955 B2 | 9/2006 | Buchhold |
| 7,112,957 B2 | 9/2006 | Bicking |
| 7,126,327 B1 | 10/2006 | Busch |
| 7,132,825 B2 | 11/2006 | Martin |
| 7,190,784 B2 | 3/2007 | Li |
| 7,193,412 B2 | 3/2007 | Freeman |
| 7,199,579 B2 | 4/2007 | Scheller et al. |
| 7,259,545 B2 | 8/2007 | Stauth et al. |
| 7,265,531 B2 | 9/2007 | Stauth et al. |
| 7,269,992 B2 | 9/2007 | Lamb et al. |
| 7,285,952 B1 | 10/2007 | Hatanaka et al. |
| 7,292,095 B2 | 11/2007 | Burt et al. |
| 7,295,000 B2 | 11/2007 | Werth |
| 7,319,319 B2 | 1/2008 | Jones et al. |
| 7,323,780 B2 | 1/2008 | Daubenspeck et al. |
| 7,323,870 B2 | 1/2008 | Tatschl et al. |
| 7,325,175 B2 | 1/2008 | Momtaz |
| 7,345,468 B2 | 3/2008 | Okada et al. |
| 7,355,388 B2 | 4/2008 | Ishio |
| 7,361,531 B2 | 4/2008 | Sharma et al. |
| 7,362,094 B2 | 4/2008 | Voisine et al. |
| 7,365,530 B2 | 4/2008 | Bailey et al. |
| 7,385,394 B2 | 6/2008 | Auburger et al. |
| 7,425,821 B2 | 9/2008 | Monreal et al. |
| 7,474,093 B2 | 1/2009 | Ausserlechner |
| 7,476,953 B2 | 1/2009 | Taylor et al. |
| 7,518,354 B2 | 4/2009 | Stauth et al. |
| 7,592,801 B2 | 9/2009 | Bailey et al. |
| 7,598,601 B2 | 10/2009 | Taylor et al. |
| 7,605,647 B1 | 10/2009 | Romero et al. |
| 7,635,993 B2 | 12/2009 | Boeve |
| 7,694,200 B2 | 4/2010 | Forrest et al. |
| 7,701,208 B2 | 4/2010 | Nishikawa |
| 7,705,586 B2 | 4/2010 | Van Zon et al. |
| 7,729,675 B2 | 6/2010 | Krone |
| 7,746,056 B2 | 6/2010 | Stauth et al. |
| 7,746,065 B2 | 6/2010 | Pastre et al. |
| 7,764,118 B2 | 7/2010 | Kusuda et al. |
| 7,768,083 B2 | 8/2010 | Doogue et al. |
| 7,769,110 B2 | 8/2010 | Momtaz |
| 7,800,389 B2 | 9/2010 | Friedrich et al. |
| 7,808,074 B2 | 10/2010 | Knittl |
| 7,816,772 B2 | 10/2010 | Engel et al. |
| 7,816,905 B2 | 10/2010 | Doogue et al. |
| 7,839,141 B2 | 11/2010 | Werth et al. |
| 7,886,610 B2 | 2/2011 | Gustafson et al. |
| 7,923,996 B2 | 4/2011 | Doogue et al. |
| 7,936,144 B2 | 5/2011 | Vig et al. |
| 7,956,604 B2 | 6/2011 | Ausserlechner |
| 7,961,823 B2 | 6/2011 | Kolze et al. |
| 7,982,454 B2 | 7/2011 | Fernandez et al. |
| 7,990,209 B2 | 8/2011 | Romero |
| 8,030,918 B2 | 10/2011 | Doogue et al. |
| 8,058,870 B2 | 11/2011 | Sterling |
| 8,063,631 B2 | 11/2011 | Fermon et al. |
| 8,063,634 B2 | 11/2011 | Sauber et al. |
| 8,080,993 B2 | 12/2011 | Theuss et al. |
| 8,106,654 B2 | 1/2012 | Theuss et al. |
| 8,128,549 B2 | 3/2012 | Testani et al. |
| 8,134,358 B2 | 3/2012 | Charlier et al. |
| 8,143,169 B2 | 3/2012 | Engel et al. |
| 8,253,210 B2 | 8/2012 | Theuss et al. |
| 8,274,279 B2 | 9/2012 | Gies |
| 8,299,783 B2 | 10/2012 | Fernandez et al. |
| 8,362,579 B2 | 1/2013 | Theuss et al. |
| 8,447,556 B2 | 5/2013 | Friedrich et al. |
| 8,461,677 B2 | 6/2013 | Ararao et al. |
| 8,486,755 B2 | 7/2013 | Ararao et al. |
| 8,542,010 B2 | 9/2013 | Cesaretti et al. |
| 8,577,634 B2 | 11/2013 | Donovan et al. |
| 8,610,430 B2 | 12/2013 | Werth et al. |
| 8,624,588 B2 | 1/2014 | Vig et al. |
| 8,629,520 B2 | 1/2014 | Doogue et al. |
| 8,629,539 B2 | 1/2014 | Milano et al. |
| 8,680,846 B2 | 3/2014 | Cesaretti et al. |
| 8,680,848 B2 | 3/2014 | Foletto et al. |
| 8,754,640 B2 | 6/2014 | Vig et al. |
| 8,773,124 B2 | 7/2014 | Ausserlechner |
| 9,081,041 B2 | 7/2015 | Friedrich et al. |
| 9,116,018 B2 | 8/2015 | Frachon |
| 9,164,156 B2 | 10/2015 | Elian et al. |
| 9,201,122 B2 | 12/2015 | Cesaretti et al. |
| 9,201,123 B2 | 12/2015 | Elian et al. |
| 9,228,860 B2 | 1/2016 | Sharma et al. |
| 9,411,025 B2 | 8/2016 | David et al. |
| 9,664,494 B2 | 5/2017 | Fernandez et al. |
| 9,797,759 B2 | 10/2017 | Lozano |
| 9,810,519 B2 | 11/2017 | Taylor et al. |
| 9,812,588 B2 | 11/2017 | Vig et al. |
| 9,817,078 B2 | 11/2017 | Pepka et al. |
| 9,823,092 B2 | 11/2017 | David et al. |
| 9,857,259 B2 | 1/2018 | Broden et al. |
| 10,145,908 B2 | 12/2018 | David et al. |
| 10,234,513 B2 | 3/2019 | Vig et al. |
| 2001/0002791 A1 | 6/2001 | Tsuge et al. |
| 2001/0009367 A1 | 7/2001 | Seitzer et al. |
| 2002/0027488 A1 | 3/2002 | Hayat-Dawoodi et al. |
| 2002/0084923 A1 | 7/2002 | Li |
| 2003/0001563 A1 | 1/2003 | Turner |
| 2003/0038675 A1 | 2/2003 | Gailus et al. |
| 2003/0062891 A1 | 4/2003 | Slates |
| 2003/0102909 A1 | 6/2003 | Motz |
| 2003/0222642 A1 | 12/2003 | Butzmann |
| 2003/0227286 A1 | 12/2003 | Dunisch et al. |
| 2004/0032251 A1 | 2/2004 | Zimmerman et al. |
| 2004/0046248 A1 | 3/2004 | Waelti et al. |
| 2004/0062362 A1 | 4/2004 | Matsuya |
| 2004/0080314 A1 | 4/2004 | Tsujii et al. |
| 2004/0135220 A1 | 7/2004 | Goto |
| 2004/0174164 A1 | 9/2004 | Ao |
| 2004/0184196 A1 | 9/2004 | Jayasekara |
| 2004/0196045 A1 | 10/2004 | Larsen |
| 2005/0017709 A1 | 1/2005 | Stolfus et al. |
| 2005/0120782 A1 | 6/2005 | Kishibata et al. |
| 2005/0122095 A1 | 6/2005 | Dooley |
| 2005/0122099 A1 | 6/2005 | Imamoto et al. |
| 2005/0167790 A1 | 8/2005 | Khor et al. |
| 2005/0179429 A1 | 8/2005 | Lohberg |
| 2005/0225318 A1 | 10/2005 | Bailey et al. |
| 2005/0280411 A1 | 12/2005 | Bicking |
| 2006/0033487 A1 | 2/2006 | Nagano et al. |
| 2006/0038559 A1 | 2/2006 | Lamb et al. |
| 2006/0068237 A1 | 3/2006 | Murphy et al. |
| 2006/0097717 A1 | 5/2006 | Tokuhara et al. |
| 2006/0125473 A1 | 6/2006 | Frachon et al. |
| 2006/0181263 A1 | 8/2006 | Doogue et al. |
| 2006/0202692 A1 | 9/2006 | Tatschl et al. |
| 2006/0261801 A1 | 11/2006 | Busch |
| 2007/0025028 A1 | 2/2007 | Chung et al. |
| 2007/0110199 A1 | 5/2007 | Momtaz et al. |

(56) References Cited

U.S. PATENT DOCUMENTS

| | | |
|---|---|---|
| 2007/0170533 A1 | 7/2007 | Doogue et al. |
| 2007/0247141 A1 | 10/2007 | Pastre et al. |
| 2007/0285089 A1 | 12/2007 | Ibuki et al. |
| 2008/0013298 A1 | 1/2008 | Sharma et al. |
| 2008/0137784 A1 | 6/2008 | Krone |
| 2008/0237818 A1 | 10/2008 | Engel et al. |
| 2008/0238410 A1 | 10/2008 | Charlier et al. |
| 2008/0270067 A1 | 10/2008 | Eriksen et al. |
| 2009/0001964 A1 | 1/2009 | Strzalkowski |
| 2009/0009163 A1 | 1/2009 | Yamada |
| 2009/0058404 A1 | 3/2009 | Kurumado |
| 2009/0071258 A1 | 3/2009 | Kouda et al. |
| 2009/0085706 A1 | 4/2009 | Baarman et al. |
| 2009/0102467 A1 | 4/2009 | Snell et al. |
| 2009/0140725 A1 | 6/2009 | Ausserlechner |
| 2009/0146647 A1 | 6/2009 | Ausserlechner |
| 2009/0152696 A1 | 6/2009 | Dimasacat et al. |
| 2009/0167298 A1 | 7/2009 | Kreutzbruck et al. |
| 2009/0168286 A1 | 7/2009 | Berkley et al. |
| 2009/0206831 A1 | 8/2009 | Fermon et al. |
| 2009/0243601 A1 | 10/2009 | Feldtkeller |
| 2009/0251134 A1 | 10/2009 | Uenoyama |
| 2009/0315543 A1 | 12/2009 | Guo et al. |
| 2010/0033175 A1 | 2/2010 | Boeve et al. |
| 2010/0052667 A1 | 3/2010 | Kohama et al. |
| 2010/0072988 A1 | 3/2010 | Hammerschmidt et al. |
| 2010/0188078 A1 | 7/2010 | Foletto et al. |
| 2010/0201356 A1 | 8/2010 | Koller et al. |
| 2010/0276769 A1 | 11/2010 | Theuss et al. |
| 2010/0295140 A1 | 11/2010 | Theuss et al. |
| 2011/0018533 A1 | 1/2011 | Cesaretti et al. |
| 2011/0031960 A1 | 2/2011 | Hohe et al. |
| 2011/0127998 A1 | 6/2011 | Elian et al. |
| 2011/0267040 A1 | 11/2011 | Frachon |
| 2011/0285384 A1 | 11/2011 | Nomura |
| 2012/0019236 A1 | 1/2012 | Tiernan et al. |
| 2012/0062215 A1 | 3/2012 | Ide et al. |
| 2013/0113474 A1 | 5/2013 | Elian |
| 2013/0147470 A1 | 6/2013 | Mulholland et al. |
| 2013/0214777 A1 | 8/2013 | Itoi |
| 2013/0241543 A1 | 9/2013 | Stenson et al. |
| 2013/0278246 A1 | 10/2013 | Stegerer et al. |
| 2013/0300401 A1 | 11/2013 | Krapf et al. |
| 2014/0150559 A1 | 6/2014 | Ishihara et al. |
| 2014/0175572 A1 | 6/2014 | Hsu et al. |
| 2014/0263287 A1 | 9/2014 | Widitora et al. |
| 2014/0327435 A1 | 11/2014 | Rohrer |
| 2014/0332232 A1 | 11/2014 | Hallendbaek et al. |
| 2014/0333295 A1* | 11/2014 | Fernandez ............ G01B 7/003 324/207.12 |
| 2015/0022197 A1 | 1/2015 | David et al. |
| 2016/0250444 A1 | 9/2016 | Lampropoulos et al. |
| 2018/0011150 A1 | 1/2018 | Pepka et al. |
| 2018/0340911 A1 | 11/2018 | Romero |
| 2018/0340986 A1 | 11/2018 | Latham et al. |
| 2018/0340987 A1 | 11/2018 | Latham et al. |
| 2018/0340988 A1 | 11/2018 | Latham et al. |
| 2018/0340989 A1 | 11/2018 | Latham et al. |
| 2018/0340990 A1 | 11/2018 | Latham et al. |

FOREIGN PATENT DOCUMENTS

| | | |
|---|---|---|
| DE | 40 31 560 A | 4/1992 |
| DE | 195 39 458 A1 | 4/1997 |
| DE | 196 34 715 A1 | 3/1998 |
| DE | 196 50 935 A1 | 6/1998 |
| DE | 198 38 433 A1 | 3/1999 |
| DE | 198 51 839 A1 | 11/1999 |
| DE | 199 61 504 A1 | 6/2001 |
| DE | 102 10 184 A1 | 9/2003 |
| DE | 103 14 602 A1 | 10/2004 |
| DE | 10 2006 037 226 A1 | 2/2008 |
| DE | 10 2007 018 238 A1 | 10/2008 |
| DE | 10 2007 041 230 B3 | 4/2009 |
| DE | 10 2010 016 584 A1 | 11/2010 |
| DE | 10 2011 102 483 A1 | 11/2012 |
| EP | 0 289 414 A2 | 11/1988 |
| EP | 0 289 414 A3 | 11/1988 |
| EP | 0 357 013 A2 | 3/1990 |
| EP | 0 357 013 A3 | 3/1990 |
| EP | 0 361 456 A2 | 4/1990 |
| EP | 0 361 456 A3 | 4/1990 |
| EP | 0629834 A1 | 12/1994 |
| EP | 0 680 103 A1 | 11/1995 |
| EP | 0 898 180 A2 | 2/1999 |
| EP | 0 944 888 B1 | 9/1999 |
| EP | 1 306 687 A2 | 5/2003 |
| EP | 1 443 332 A1 | 8/2004 |
| EP | 1 580 560 A1 | 9/2005 |
| EP | 1 637 898 A1 | 3/2006 |
| EP | 1 662 353 A1 | 5/2006 |
| EP | 1 679 524 A1 | 7/2006 |
| EP | 1 797 496 B1 | 6/2007 |
| EP | 1 850 143 A1 | 10/2007 |
| EP | 2 063 229 A1 | 5/2009 |
| EP | 1 797 496 | 7/2009 |
| EP | 2 402 719 A1 | 1/2012 |
| EP | 3 139 190 A1 | 8/2017 |
| FR | 2 748 105 A1 | 10/1997 |
| FR | 2 209 756 A1 | 6/2008 |
| GB | 2 135 060 A | 8/1984 |
| GB | 2 276 727 A | 10/1994 |
| GB | 2 481 482 A | 12/2011 |
| JP | S5771504 A | 5/1982 |
| JP | S60182503 A | 9/1985 |
| JP | 363 084176 A | 4/1988 |
| JP | 63-300911 | 12/1988 |
| JP | H02-116753 | 5/1990 |
| JP | H03-29817 | 2/1991 |
| JP | H03-35182 A | 2/1991 |
| JP | H04-095817 | 3/1992 |
| JP | H06-273437 | 9/1994 |
| JP | 08-097486 A | 4/1996 |
| JP | H08-511348 A | 11/1996 |
| JP | 09-166612 | 6/1997 |
| JP | 63-263782 A | 10/1998 |
| JP | 10-332725 | 12/1998 |
| JP | H10-318784 A | 12/1998 |
| JP | 11-064363 | 3/1999 |
| JP | 11-074142 | 3/1999 |
| JP | 2000-183241 | 6/2000 |
| JP | 2001-043475 A | 2/2001 |
| JP | 2001-141738 | 5/2001 |
| JP | 2001-165702 A | 6/2001 |
| JP | 2001-165951 | 6/2001 |
| JP | 2002-117500 A | 4/2002 |
| JP | 2002-149013 A | 5/2002 |
| JP | 2002-357920 A | 12/2002 |
| JP | 2003-177171 | 6/2003 |
| JP | 2003-202365 A | 7/2003 |
| JP | 2004-055932 A | 2/2004 |
| JP | 2004-093381 | 3/2004 |
| JP | 2004-152688 A | 5/2004 |
| JP | 2004-356338 A | 12/2004 |
| JP | 2004-357858 A | 12/2004 |
| JP | 2005-517928 A | 6/2005 |
| JP | 2005-337866 A | 12/2005 |
| JP | 2005-345302 A | 12/2005 |
| JP | 2006-003096 A | 1/2006 |
| JP | 2006-3116 A | 1/2006 |
| JP | 2006-275764 A | 10/2006 |
| JP | 2006-284466 A | 10/2006 |
| JP | 2007-012582 A | 1/2007 |
| JP | 2007-218799 A | 8/2007 |
| JP | 2008-180550 A | 8/2008 |
| JP | 2008-264569 A | 11/2008 |
| JP | 2009-222524 A | 10/2009 |
| JP | 2011/086479 A | 4/2011 |
| JP | 2012-501446 A | 1/2012 |
| JP | 61-48777 | 5/2017 |
| WO | WO 88/09026 | 11/1988 |
| WO | WO 1993/12403 | 6/1993 |
| WO | WO 1994/08203 | 4/1994 |

(56) References Cited

FOREIGN PATENT DOCUMENTS

| | | |
|---|---|---|
| WO | WO 94/29672 | 12/1994 |
| WO | WO 1995/18982 | 7/1995 |
| WO | WO 96/02849 A1 | 2/1996 |
| WO | WO 1999/49322 A1 | 9/1999 |
| WO | WO 2001/40790 A1 | 6/2001 |
| WO | WO 01/074139 A3 | 10/2001 |
| WO | WO 2001/74139 A2 | 10/2001 |
| WO | WO 2003/069358 A2 | 8/2003 |
| WO | WO 2003/069358 A3 | 8/2003 |
| WO | WO 2003/107018 A1 | 12/2003 |
| WO | WO 2004/027436 A1 | 4/2004 |
| WO | WO 2004/072672 A1 | 8/2004 |
| WO | WO 2005/013363 A | 2/2005 |
| WO | WO 2005/013363 A3 | 2/2005 |
| WO | WO 2006/035342 A1 | 4/2006 |
| WO | WO 2006/056829 A1 | 6/2006 |
| WO | WO 2006/083479 A1 | 8/2006 |
| WO | WO 2007/095971 A1 | 8/2007 |
| WO | WO 2007/138508 A1 | 12/2007 |
| WO | WO 2008/008140 A2 | 1/2008 |
| WO | WO 2008/008140 A3 | 1/2008 |
| WO | WO 2008/048379 A1 | 4/2008 |
| WO | WO 2008/121443 A1 | 10/2008 |
| WO | WO 2008/145662 A1 | 12/2008 |
| WO | WO 2009/108422 | 9/2009 |
| WO | WO 2009/108422 A2 | 9/2009 |
| WO | WO 2010/014309 A1 | 2/2010 |
| WO | WO 2010/027658 A2 | 3/2010 |
| WO | WO 2010/065315 A1 | 6/2010 |
| WO | WO 2010/096367 A1 | 8/2010 |
| WO | WO 2011/011479 A1 | 1/2011 |
| WO | WO 2012/148646 A1 | 11/2012 |
| WO | WO 2013/169455 A1 | 11/2013 |
| WO | WO 2014/105302 A1 | 7/2014 |
| WO | WO 2015/058733 A1 | 4/2015 |

OTHER PUBLICATIONS

Chinese Office Action with English translation dated Jan. 28, 2021 for Chinese Application No. 201880034816.2; 10 pages.
International Preliminary Report on Patentability dated Dec. 5, 2019 for PCT Application PCT/US2018/028476; 8 pages.
Response to Office Action filed Nov. 13, 2020 for U.S. Appl. No. 16/390,355; 9 pages.
Notice of Allowance dated Jan. 27, 2021 for U.S. Appl. No. 16/390,355; 10 pages.
Communication pursuant to Rules 161(1) and 162 EPC dated Jan. 10, 2020 for European Application No. 18723195.6; 3 pages.
Response to communication pursuant to Rules 161(1) and 162 EPC filed on Jul. 16, 2020 for European Application No. 18723195.6; 11 pages.
Japanese Office Action (with English Translation) dated Jan. 13, 2017 for Japanese Application No. 2015-511491; 11 Pages.
Ahn et al.; "A New Toroidal-Meander Type Integrated Inductor with a Multilevel Meander Magnetic Core;" IEEE Transaction on Magnetics; vol. 30; No. 1; Jan. 1, 1994; 7 pages.
Allegro "Two-Wire True Zero Speed Miniature Differential Peak-Detecting Gear Tooth Sensor;" ATS645LSH; 2004; Allegro MicroSystems, Inc., Manchester, NH, 03103; 14 pages.
Allegro Microsystems, Inc., "Gear-Tooth Sensor for Automotive Applications," Aug. 3, 2001; 2 pages.
Allegro MicroSystems, Inc., Hall-Effect IC Applications Guide, http://www.allegromicro.com/en/Products/Design/an/an27701.pdf, Copyright 1987, 1997; 36 pages.
Alllegro "True Zero-Speed Low-Jitter High Accuracy Gear Tooth Sensor;" ATS625LSG; 2005; Allegro MicroSystems, Inc. Manchester, NH 03103; 21 pages.
Response with RCE to U.S. Final Office Action dated Jun. 9, 2015 for U.S. Appl. No. 13/946,400; Response with RCE filed Sep. 9, 2015; 12 pages.

Ausserlechner et al.; "Compensation of the Piezo-Hall Effect in Integrated Hall Sensors on (100)-Si;" IEEE Sensors Journal, vol. 7, No. 11; Nov. 2007; ISBN: 1530-437X; 8 pages.
Ausserlechner et al.; "Drift of Magnetic Sensitivity of Small Hall Sensors Due to Moisture Absorbed by the IC-Package;" Proceedings of IEEE Sensors, 2004; vol. 1; Oct. 24, 2004; ISBN:0-7803-8692-2; 4 pages.
Ausserlechner; "Limits of Offset Cancellation by the Principle of Spinning Current Hall Probe;" Proceedings of IEEE Sensors; Oct. 2004; 4 pages.
Ausserlechner; "The piezo-Hall effect in n-silicon for arbitrary crystal orientation;" Proceedings of IEEE Sensors; vol. 3; Oct. 24, 2004; ISBN: 0-7803-8692-2; 4 pages.
Bahreyni, et al.; "A Resonant Micromachined Magnetic Field Sensor;" IEEE Sensors Journal; vol. 7, No. 9, Sep. 2007; 9 pages.
Barrettino, et al.; "CMOS-Based Monolithic Controllers for Smart Sensors Comprising Micromembranes and Microcantilevers;" IEEE Transactions on Circuits and Systems-I Regular Papers vol. 54, No. 1; Jan. 2007; 12 pages.
Baschirotto et al.; "Development and Analysis of PCB Vector 2-D Magnetic Field Sensor System for Electronic Compass;" IEEE Sensors Journal vol. 6, No. 2; Apr. 2006; 7 pages.
Bilotti et al.; "Monolithic Magnetic Hall Sensor Using Dynamic Quadrature Offset Cancellation;" IEEE Journal of Solid-State Circuits; vol. 32, Issue 6; Jun. 1997; 8 pages.
Bowers et al., "Microfabrication and Process Integration of Powder-Based Permanent Magnets", Interdisciplinary Microsystems Group, Dept. Electrical and Computer Engineering, University of Florida, USA; Technologies for Future Micro-Nano Manufacturing Workshop, Napa, California, Aug. 8-10; 2011; 4 pages.
Communication Pursuant to Rule 161(1) and 162 EPC dated Feb. 23, 2016; for European Application No. 14742423.8; 2 pages.
Communication Pursuant to Rules 161(1) and 162 dated Nov. 12, 2015 for European Application No. 14726492.3; 2 pages.
Daughton J: "Spin-dependent sensors", Proceedings of the IEEE New York, US, vol. 91. No. 5; May 2003; 6 pages.
Decision to Grant dated Oct. 27, 2016; for European Application No. 13722619.7; 2 pages.
Demierre, et al.; "Reference Magnetic Actuator for Self-Calibration of a Very Small Hall Sensor Array;" Sensors and Actuators A 97-98; Apr. 2002; 8 pages.
Dwyer; "Back-Biased Packaging Advances (SE, SG & SH versus SA & SB)," http://www.allegromicro.com/en/Products/Design/packaging_advances/index.asp, Copyright 2008; 5 pages.
European Communication under Rule 71(3) EPC, Intention to Grant dated Jun. 2, 2016 for European Application No. 13722619.7; 26 Pages.
European Extended Search Report dated Dec. 22, 2016; for European Application No. 16193227.2; 11 pages.
European Response filed on Aug. 24, 2016 to the official communication dated Feb. 23, 2016; for European Application No. 14742423.8; 13 pages.
European Response to Written Opinion filed on May 21, 2015; for European Application No. 13722619.7, 9 pages.
U.S. Final Office Action dated Aug. 28, 2015; for U.S. Appl. No. 13/946,417; 30 pages.
U.S. Final Office Action dated Jun. 9, 2015; for U.S. Appl. No. 13/946,400; 17 pages.
U.S. Final Office Action dated Oct. 20, 2016 for U.S. Appl. No. 13/946,400; 20 pages.
U.S. Final Office Action dated Oct. 6, 2016; for U.S. Appl. No. 13/946,417; 34 pages.
Frick, et al.; "CMOS Microsystem for AC Current Measurement with Galvanic Isolation;" IEEE Sensors Journal; vol. 3, No. 6; Dec. 2003; 9 pages.
Halg; "Piezo-Hall Coefficients of n-Type Silicon;" Journal of Applied Physics; vol. 64, No. 1; Jul. 1, 1988; 7 pages.
Honeywell International, Inc., "Hall Effect Sensing and Application," Micro Switch Sensing and Control, Chapter 3, http://content.honeywell.com/sensing/prodinfo/solidstate/technical/hallbook.pdf, date unavailable but believed to be before Jan. 2008; 11 pages.
Hosticka; "CMOS Sensor Systems;" Sensors and Actuators A66; Apr. 1998; 7 pages.

(56) References Cited

OTHER PUBLICATIONS

Infineon Product Brief, TLE 4941plusC, Differential Hall IC for Wheel Speed Sensing, Oct. 2010, www.infineon.com/sensors, 2 pages.
PCT International Preliminary Report on Patentability dated Jan. 28, 2016 for International Application No. PCT/US2014/044993; 9 pages.
PCT International Search Report and Written Opinion dated Nov. 3, 2014 for International Application No. PCT/US2014/044993; 16 pages.
PCT International Search Report and Written Opinion dated Oct. 28, 2014 for International Application No. PCT/US2014/044991; 13 pages.
Japanese Office Action (with English Translation) dated May 18, 2017 for Japanese Application No. 2015-511491; 8 pages.
Japanese Office Action dated Jan. 18, 2017 for Japanese Application No. 2016-512930; 7 pages.
Japanese Voluntary Amendment with English Claims dated Dec. 28, 2016; for Japanese Pat. App. No. 2016-528006; 8 pages.
Johnson et al., "Hybrid Hall Effect Device," Appl. Phys. Lett., vol. 71, No. 7, Aug. 1997; 3 pages.
Kanda et al.; "The Piezo-Hall Effect in n-Silicon;" $22^{nd}$ International Conference on the Physics of Semiconductors; vol. 1, Jan. 1995; 4 pages.
Kapser et al.; "Integrated GMR Based Wheel Speed Sensor for Automotive Applications;" IEEE 2007 Conference on Sensors; Oct. 2007; 4 pages.
Kammerer et al.: "A Hall effect sensors network insensitive to mechanical stress;" Proceedings of IEEE Sensors; vol. 3, Oct. 2004; 4 pages.
Lagorce et al.; "Magnetic and Mechanical Properties of Micromachined Strontium Ferrite/Polyimide Composites;" Journal of Microelectromechanical Systems; vol. 6, No. 4; Dec. 1997; 6 pages.
Lequesne et al.; "High-Accuracy Magnetic Position Encoder Concept;" IEEE Transactions on Industry Applications; vol. 35, No. 3; May/Jun. 1999; 9 pages.
Magnani et al.; "Mechanical Stress Measurement Electronics Based on Piezo-Resistive and Piezo-Hall Effects;" $9^{th}$ International Conference on Electronics, Circuits and Systems 2002; vol. 1; SBN: 0-7803-7596-3; Dec. 2002; 4 pages.
Manic et al.; "Short and Long-Term Stability Problems of Hall Plates in Plastic Packages;" IEEE $38^{th}$ Annual International Reliability Physics Symposium; Apr. 2000; 6 pages.
Manic; "Drift in Silicon Integrated Sensors and Circuits Due to the Thermo-Mechanical Stresses;" Lausanne, École Polytechnique Fédérale De Lausanne 2000; 176 pages.
Melexis Microelectronic Systems, Hall Applications Guide, Section 3—Applications,1997; 48 pages.
Motz et al.; "An Integrated Magnetic Sensor with Two Continuous-Time ΔΣ-Converters and Stress Compensation Capability;" IEEE International Solid-State Circuits Conference; Digest of Technical Papers; Feb. 6, 2006; ISBN: 1-4244-0079-1; 7 pages.
Motz, et al.; "A Chopped Hall Sensor with Small Jitter and Programmable "True Power-On" Function;" IEEE Journal of Solid-State Circuits; vol. 40, No. 7; Jul. 2005; 8 pages.
Motz, et al.; "An Integrated Hall Sensor Platform Design for Position, Angle and Current Sensing;" IEEE Sensors 2006; Exco, Daegu, Korea / Oct. 22-25, 2006; 4 pages.
Munter; "A Low-offset Spinning-current Hall Plate;" Sensors and Actuators A21-A23; 1990; 4 pages.
Munter; "Electronic Circuitry for a Smart Spinning-current Hall Plate with Low Offset;" Sensors and Actuators A; Jun. 1991; 5 pages.
U.S. Non-Final Office Action dated Dec. 3, 2015; for U.S. Appl. No. 13/946,417; 26 pages.
U.S. Non-Final Office Action dated Nov. 19, 2015; for U.S. Appl. No. 13/946,400; 19 pages.
Notice of Allowance dated Apr. 19, 2017 for U.S. Appl. No. 13/891,519; 11 pages.
Notice of Allowance dated Jul. 25, 2017 for U.S. Appl. No. 13/468,478; 7 Pages.
Notice of Allowance dated Mar. 1, 2017 for U.S. Appl. No. 13/891,519; 7 pages.
Notice of Allowance dated May 15, 2017 for U.S. Appl. No. 13/468,478; 7 Pages.
U.S. Non-Final Office Action dated Mar. 20, 2015; for U.S. Appl. No. 13/946,417; 20 pages.
U.S. Non-Final Office Action dated Jan. 15, 2014 for U.S. Appl. No. 13/468,478; 9 pages.
Oniku et al.; "High-Energy-Density Permanent Micromagnets Formed from Heterogeneous Magnetic Powder Mixtures;" IEEE $25^{th}$ International Conference on Micro Electro Mechanical Systems, Jan. 2012; 4 pages.
Park et al.; "Ferrite-Based Integrated Planar Inductors and Transformers Fabricated at Low Temperature;" IEEE Transactions on Magnetics; vol. 33; No. 5; Sep. 1997; 3 pages.
Park et al.;"Batch-Fabricated Microinductors with Electroplated Magnetically Anisotropic and Laminated Alloy Cores", IEEE Transactions on Magnetics, vol. 35, No. 5, Sep. 1999, 10 pages.
Partin et al.; "Temperature Stable Hall Effect Sensors;" IEEE Sensors Journal, vol. 6, No. 1; Feb. 2006; 5 pages.
Pastre et al.; "A Hall Sensor Analog Front End for Current Measurement with Continuous Gain Calibration;" IEEE Sensors Journal; vol. 7, No. 5; May 2007; 8 pages.
Pastre et al.; "A Hall Sensor-Based Current Measurement Microsystem With Continuous Gain Calibration;" Research in Microelectronics and Electronics, IEEE vol. 2; Jul. 25; 2005; ISBN: 0-7803-9345-7; 4 pages.
PCT International Preliminary Report and Written Opinion dated Jan. 28, 2016 for International Application No. PCT/US2014/044991; 9 pages.
PCT International Preliminary Report dated Nov. 19, 2015 for International Application No. PCT/US2014/035594; 13 pages.
PCT International Preliminary Report on Patentability and Written Opinion of the ISA dated Nov. 20, 2014; For PCT Pat. App. No. PCT/US2013/037065; 11 pages.
PCT International Search Report and Written Opinion dated Jul. 17, 2013 for International Application No. PCT/US2013/037065; 13 pages.
PCT International Search Report and Written Opinion dated Sep. 12, 2014 for International Application No. PCT/US2014/035594; 16 pages.
Popovic; "Sensor Microsystems;" Proc. $20^{th}$ International Conference on Microelectronics (MWIL 95); vol. 2, NIS, Serbia, Sep. 12-14, 1995; 7 pages.
Randhawa; "Monolithic Integrated Hall Devices in Silicon Circuits;" Microelectronics Journal; vol. 12, No. 6; Sep. 14-17, 1981; 6 pages.
Response (with Amended Claims in English) to Japanese Office Action dated Feb. 13, 2017 for Japanese Application No. 2015-511491; Response filed on Apr. 11, 2017; 11 pages.
Response (with RCE) to U.S. Final Office Action dated Sep. 16, 2015 for U.S. Appl. No. 13/468,478; Response filed Jan. 14, 2016; 18 pages.
Response (with RCE) to U.S. Final Office Action dated Feb. 16, 2016 for U.S. Appl. No. 13/891,519; Response filed May 12, 2016; 16 pages.
Response (with RCE) to U.S. Final Office Action dated Nov. 25, 2016 for U.S. Appl. No. 13/891,519; Response filed Feb. 6, 2017; 18 pages.
Response to U.S. Non-Final Office Action dated Dec. 3, 2015 for U.S. Appl. No. 13/946,417; Response filed Mar. 3, 2016; 17 pages.
Response (with RCE) to U.S. Final Office Action dated Aug. 28, 2015 for U.S. Appl. No. 13/946,417; Response filed Nov. 9, 2015; 17 pages.
Response to U.S. Non-Final Office Action dated Jan. 5, 2015; for U.S. Appl. No. 13/946,400; Response filed Apr. 3, 2015; 13 pages.
Response to U.S. Final Office Action dated Oct. 20, 2016 for U.S. Appl. No. 13/946,400; Response filed Jan. 19, 2017; 12 Pages.
Response to U.S. Non-Final Office Action dated Mar. 20, 2015 for U.S. Appl. No. 13/946,417; Response filed Jun. 19, 2015; 15 pages.

(56) References Cited

OTHER PUBLICATIONS

Response to U.S. Non-Final Office Action dated May 10, 2016 for U.S. Appl. No. 13/468,478; Response filed Oct. 3, 2016; 17 pages.
Response to Communication dated Dec. 11, 2015 for European Application No. 14726492.3; 17 pages.
Response to Japanese Office Action dated Jan. 18, 2017 for Japanese Application No. 2016-512930; Response Filed Apr. 18, 2017; 13 pages.
Response (with RCE) to U.S. Final Office Action dated Oct. 6, 2016 for U.S. Appl. No. 13/946,417; Response filed Jan. 24, 2017; 14 Pages.
Response to U.S. Non-Final Office Action dated Apr. 6, 2017 for U.S. Appl. No. 13/946,400; Response filed Jun. 30, 2017; 12 pages.
Response to U.S. Final Office Action dated Feb. 10, 2017 for U.S. Appl. No. 13/468,478; Response filed May 3, 2017; 9 Pages.
Response (with RCE) to U.S. Final Office Action dated Jul. 17, 2014 for U.S. Appl. No. 13/468,478; Response filed Jan. 19, 2015; 14 Pages.
Response (with RCE) to U.S. Final Office Action dated Oct. 20, 2016 for U.S. Appl. No. 13/946,400; Response filed Feb. 23, 2017; 17 Pages.
Response to U.S. Non-Final Office Action dated Aug. 24, 2015 for U.S. Appl. No. 13/891,519; Response filed Nov. 20, 2015; 11 pages.
Response to U.S. Non-Final Office Action dated Feb. 12, 2015 for U.S. Appl. No. 13/468,478; Response filed Jun. 18, 2015; 11 Pages.
Response to U.S. Non-Final Office Action dated Jan. 15, 2014 for Appl. No. 13/468,478; Response filed Jun. 12, 2014; 11 Pages.
Response to U.S. Non-Final Office Action dated Jun. 3, 2016 for U.S. Appl. No. 13/891,519; Response filed Sep. 1, 2016; 14 pages.
Response to U.S. Non-Final Office Action dated Mar. 15, 2017 for Appl. No. 13/946,417; Response filed Jun. 14, 2017; 10 pages.
Response to U.S. Non-Final Office Action dated Nov. 19, 2015 for U.S. Appl. No. 13/946,400; Response filed Feb. 17, 2016; 11 Pages.
Ruther et al.; "Integrated CMOS-Based Sensor Array for Mechanical Stress Mapping;" $5^{th}$ IEEE Conference on Sensors; Oct. 22-25, 2006; 4 pages.
Ruther et al.; "Thermomagnetic Residual Offset in Integrated Hall Plates;" IEEE Sensors Journal; vol. 3, No. 6; Dec. 2003; 7 pages.
Sargent; "Switched-capacitor IC controls feedback loop;" EDN; Design Ideas; Feb. 17, 2000; 2 pages.
Schneider; "Temperature Calibration of CMOS Magnetic Vector Probe for Contactless Angle Measurement System," IEDM 1996; 4 Pages.
Schott et al.; "Linearizing Integrated Hall Devices;" 1997 International Conference on Solid-State Sensors and Actuators; Jun. 16-19, 1997; 4 Pages.
Schott, et al.; "CMOS Single-Chip Electronic Compass with Microcontroller;" IEEE Journal of Solid-State Circuits; vol. 42, No. 12; Dec. 2007; 11 pages.
Simon et al.; "Autocalibration of Silicon Hall Devices;" $8^{th}$ International Conference on Solid-State Sensors and Actuators; vol. 2; Jun. 25-29, 1995; 4 pages.
Smith et al.; "Low Magnetic Field Sensing with Gmr Sensors;" Sensor Magazine; Part 1; Sep. 1999; http://archives.sensorsmag.com/articles/0999/76mail.shtml; 8 pages.
Smith et al.; "Low Magnetic Field Sensing with GMR Sensors;" Sensor Magazine; Part 2; Oct. 1999; http://archives.sensorsmag.com/articles/1099/84/mail.shtml; 11 pages.
Steiner et al.; "Double-Hall Sensor with Self-Compensated Offset;" International Electron Devices Meeting; Dec. 7, 1997; ISBN: 0-7803-4100-7; 4 pages.
Steiner et al; Offset Reduction in Hall Devices by Continuous Spinning Current Method; Sensors and Actuators A66; 1998; 6 pages.
Stellrecht et al.; Characterization of Hygroscopic Swelling Behavior of Mold Compounds and Plastic Packages; IEEE Transactions on Components and Packaging Technologies; vol. 27, No. 3; Sep. 2004; 8 pages.
Tian et al.; "Multiple Sensors on Pulsed Eddy-Current Detection for 3-D Subsurface Crack Assessment;" IEEE Sensors Journal; vol. 5, No. 1; Feb. 2005; 7 pages.
Trontelj et al; "CMOS Integrated Magnetic Field Source Used as a Reference in Magnetic Field Sensors on Common Substrate;" WEP 1-6; IMTC; May 1994; 3 pages.
U.S. Advisory Action dated Feb. 16, 2017 for U.S. Appl. No. 13/946,400; 4 Pages.
U.S. Final Office Action dated Feb. 10, 2017 for U.S. Appl. No. 13/468,478; 17 Pages.
U.S. Final Office Action dated Feb. 16, 2016 for U.S. Appl. No. 13/891,519; 14 pages.
U.S. Final Office Action dated Jul. 17, 2014 for U.S. Appl. No. 13/468,478; 13 Pages.
U.S. Final Office Action dated Nov. 25, 2016 for U.S. Appl. No. 13/891,519; 13 pages.
U.S. Final Office Action dated Sep. 16, 2015 for U.S. Appl. No. 13/468,478; 19 Pages.
U.S. Final Office Action dated Sep. 8, 2017 for U.S. Appl. No. 13/946,417; 26 pages.
U.S. Non-Final Office Action dated Apr. 6, 2017 for U.S. Appl. No. 13/946,400; 25 Pages.
U.S. Non-Final Office Action dated Aug. 24, 2015 for U.S. Appl. No. 13/891,519; 14 pages.
U.S. Non-Final Office Action dated Feb. 12, 2015 for U.S. Appl. No. 13/468,478; 14 Pages.
U.S. Non-Final Office Action dated Jan. 5, 2015 for U.S. Appl. No. 13/946,400; 24 Pages.
U.S. Non-Final Office Action dated Jun. 3, 2016 for U.S. Appl. No. 13/891,519; 17 pages.
U.S. Non-Final Office Action dated Mar. 15, 2017 from U.S. Appl. No. 13/946,417; 25 Pages.
U.S. Non-Final Office Action dated May 10, 2016 for U.S. Appl. No. 13/468,478; 15 Pages.
Udo; "Limits of Offset Cancellation by the Principle of Spinning Current Hall Probe;" Proceedings of IEEE Sensors; Oct. 2004; 4 pages.
Voluntary Amendment dated Nov. 2, 2016 with English claims for Chinese Application No. 201480040243.6; 13 pages.
Voluntary Amendment with English Claims dated Nov. 7, 2016 for Korean App. No. 10-2016-7004178; 11 Pages.
Wu, et al.; "A Chopper Current-Feedback Instrumentation Amplifier with a 1mHz 1/f Noise Corner and an AC-Coupled Ripple-Reduction Loop;" IEEE International Solid-State Circuits Conference; Feb. 10, 2009; 3 pages.
Zou et al.; "Three-Dimensional Die Surface Stress Measurements in Delaminated and Non-Delaminated Plastic Packages;" 48th Electronic Components and Technology Conference; May 25, 1998; 12 pages.
Response to Official Communication dated Mar. 13, 2017 for European Application No. 16193227.2; 7 pages.
U.S. Final Office Action dated Oct. 5, 2017 for U.S. Appl. No. 13/946,400; 27 pages.
PCT International Search Report and Written Opinion dated Jul. 6, 2018 for International Application No. PCT/US2018/028476; 13 pages.
U.S. Non-Final Office Action dated Oct. 31, 2018 for U.S. Appl. No. 15/606,362; 15 pages.
Response to U.S. Non-Final Office Action dated Oct. 31, 2018 for U.S. Appl. No. 15/606,362; Response filed Jan. 31, 2019; 11 pages.
Notice of Allowance dated Apr. 5, 2019 for U.S. Appl. No. 15/606,362; 9 pages.
Response to U.S. Non-Final Office Action dated Jan. 24, 2019 for U.S. Appl. No. 15/606,358; Response filed Apr. 17, 2019; 12 pages.
Office Action dated Oct. 14, 2020 for U.S. Appl. No. 16/390,355; 10 pages.
U.S. Appl. No. 16/390,355, filed Apr. 22, 2019, Cadugan et al.
Intention of Grant dated Mar. 22, 2021 for European Application No. 18723195.6; 7 pages.

\* cited by examiner ated magnetic field sensor.

COIL ACTUATED PRESSURE SENSOR AND DEFLECTABLE SUBSTRATE

FIELD

This disclosure relates to pressure sensors and, more particularly, to pressure sensors including a coil actuated magnetic field sensor.

BACKGROUND

Magnetic field sensors are often used to detect a ferromagnetic target. They often act as sensors to detect motion or position of the target. Such sensors are ubiquitous in many areas of technology including robotics, automotive, manufacturing, etc. For example, a magnetic field sensor may be used to detect when a vehicle's wheel locks up, triggering the vehicle's control processor to engage the anti-lock braking system. In this example, the magnetic field sensor may detect rotation of the wheel. Magnetic field sensors may also detect distance between the magnetic field sensor and an object. Sensors such as these may be used to detect the proximity of the object as it moves toward and away from the magnetic field sensor.

SUMMARY

In an embodiment, a pressure sensor includes a conductive substrate having a cavity which forms a thin portion of the substrate that can be deformed by a pressure differential across the conductive substrate. The pressure sensor also includes a magnetic field sensor. The magnetic field sensor has at least one coil responsive to an AC coil drive signal and positioned proximate to the thin portion of the substrate so that a magnetic field produced by the at least one coil induces eddy currents in the thin portion of the substrate that generate a reflected magnetic field. At least one magnetic field sensing element is disposed proximate to the at least one coil and to the thin portion of the substrate and configured to generate a magnetic field signal in response to the reflected magnetic field. The magnetic field sensor is positioned so that deformation of the thin portion of the substrate causes a distance between the thin portion of the substrate and the magnetic field sensor to change.

One or more of the following features may be included.

A strength of the reflected magnetic field may be responsive to the distance between the thin portion of the substrate and the magnetic field sensor.

A value of the magnetic field signal may be responsive to the distance between the thin portion of the substrate and the magnetic field sensor.

A second substrate that supports the magnetic field sensor may be included.

The second substrate may be a printed circuit board, the magnetic field sensor may an integrated circuit, and the printed circuit board may support the integrated circuit.

A backing plate may be physically coupled to the substrate to form one wall of the cavity, wherein the second substrate is supported by the backing plate.

The cavity may be substantially rectangular and have squared corners and/or rounded corners.

A second cavity may be present, wherein the cavity and the second cavity are positioned on opposite sides of the conductive substrate, and the thin portion is formed between the cavity and the second cavity.

The second cavity may be substantially rectangular in shape and may have squared corners and/or rounded corners.

The cavity and the second cavity may have substantially the same length.

The second cavity may be a rounded hollow in the conductive substrate.

The second cavity may have a stepped shape.

The stepped shape may form a deep portion and a shallow portion. The shallow portion may be configured to engage a second substrate that supports the magnetic field sensor. The second substrate is positioned so that the magnetic field sensor is positioned in the deep portion.

The stepped shape may be asymmetric and may form a deep portion adjacent to the thin, deformable portion of the conductive substrate; and a shallow portion, The magnetic field sensor may include at least two magnetic field sensing elements and may be positioned so that a first magnetic field sensing element is positioned in the shallow portion and a second magnetic field sensing element is positioned in the deep portion.

The first magnetic field sensing element may produce a reference signal and the second magnetic field sensing element may produce the magnetic field signal.

The conductive substrate may comprise mounting posts to mount a second substrate and/or a backing plate that supports a second substrate.

The conductive substrate may form a pipe and the cavity may be formed on an inner surface of the pipe.

A second cavity may be formed on an outer surface of the pipe and positioned so that the cavity and the second cavity form the thin portion.

A pressure within the pipe may cause the thin portion to deform and the distance between the thin portion and the magnetic field sensor to change.

The at least one magnetic field sensing element may comprise a magnetoresistance element, a Hall effect element, or both.

In another embodiment, a pressure sensor includes a conductive substrate; means for forming a thin portion of the substrate that can be deformed by a pressure differential across the conductive substrate; and a magnetic field sensor comprising: at least one coil responsive to an AC coil drive signal and positioned proximate to the thin portion of the substrate so that a magnetic field produced by the at least one coil induces eddy currents in the thin portion of the substrate that generate a reflected magnetic field. At least one magnetic field sensing element is disposed proximate to the at least one coil and to the thin portion of the substrate and configured to generate a magnetic field signal in response to the reflected magnetic field. The magnetic field sensor is positioned so that deformation of the thin portion of the substrate causes a distance between the thin portion of the substrate and the magnetic field sensor to change.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the invention. Like numbers in the figures denote like elements.

DETAILED DESCRIPTION

As used herein, the term "magnetic field sensing element" is used to describe a variety of electronic elements that can sense a magnetic field. The magnetic field sensing element can be, but is not limited to, a Hall Effect element, a magnetoresistance element, or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the terms "target" and "magnetic target" are used to describe an object to be sensed or detected by a magnetic field sensor or magnetic field sensing element.

Figure 1:
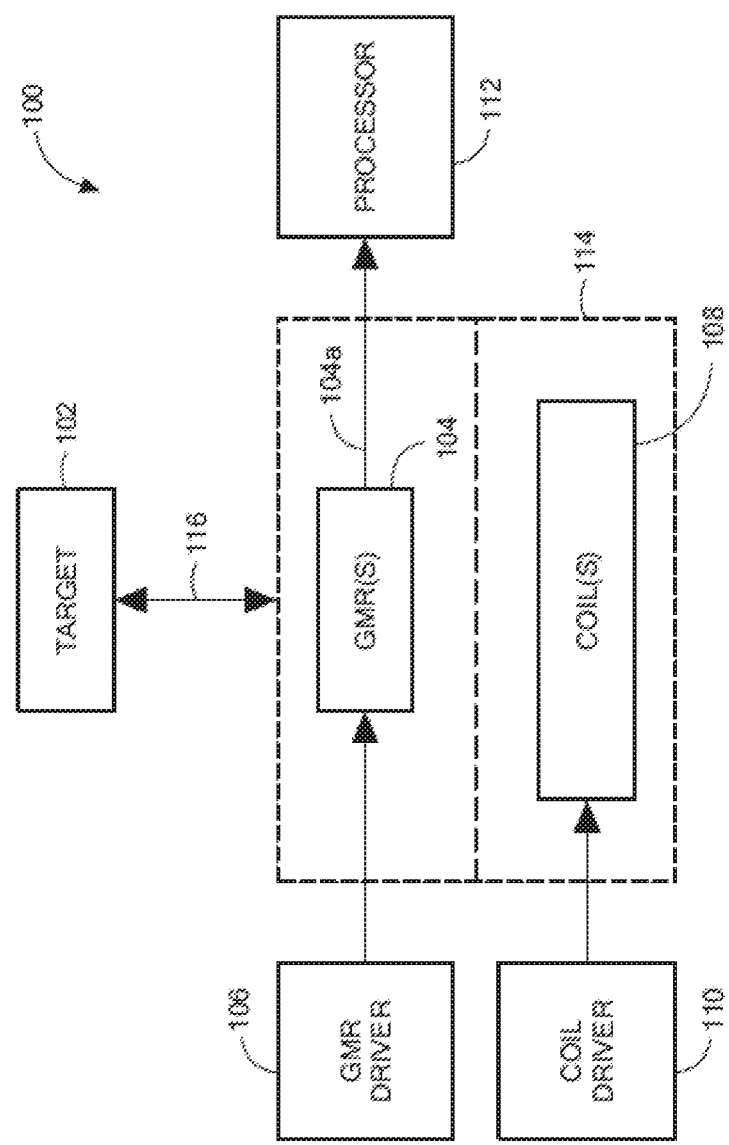
FIG. 1 is a block diagram of a magnetic field sensor with coil actuation.

FIG. 1 is a block diagram of a system 100 for detecting a conductive target 102. Target 102 may be magnetic or non-magnetic in various embodiments. System 100 includes one or more magnetoresistance (MR) elements 104 and an MR driver circuit 106. MR driver circuit may include a power supply or other circuit that provides power to MR elements 104. In embodiments, MR elements 104 may be replaced with other types of magnetic field sensing elements such as Hall effect elements, etc. MR elements 104 may comprise a single MR element or multiple MR elements. The MR elements may be arranged in a bridge configuration, in certain embodiments.

System 100 may also include one or more coils 108 and a coil driver circuit 110. Coils 108 may be electrical coils, windings, wires, traces, etc. configured to generate a magnetic field when current flows through the coils 108. In embodiments, coils 108 comprise two or more coils, each a conductive trace supported by substrate, such as a semiconductor substrate, a glass substrate, a ceramic substrate, or the like. In other embodiments, coils 108 may not be supported by a substrate. For example, coils 108 may be supported by a chip package, a frame, a PCB, a ceramic substrate, or any other type of structure that can support traces of a coil. In other embodiments, coils 108 may be free standing wire, i.e. a wire wound coil not supported by a separate supporting structure.

Coil driver 110 is a power circuit that supplies current to coils 108 to generate the magnetic field. In an embodiment, coil driver 110 may produce a changing current, such as a pulsed current, a ramped current, n alternating current, or any other shaped current that changes over time so that coils 108 produce changing magnetic fields (i.e. magnetic fields with magnetic moments that change over time). Coil driver 110 may be a circuit implemented, in whole or in part, on the semiconductor die.

System 100 may also include processor 112 coupled to receive signal 104a from MR elements 104, which may represent the magnetic field as detected by MR elements 104. Processor 100 may receive signal 104a and use it to determine a position, speed, direction, or other property of target 102.

MR elements 104 and coils 108 may be positioned on substrate 114. Substrate 114 may comprise semiconductor substrates, such as silicon substrates, a chip package, PCB or other type of board-level substrates, or any type of platform that can support MR elements 104 and coils 108. Substrate 114 may include a single substrate or multiple substrates, as well as a single type of substrate or multiple types of substrates.

In operation, MR driver 106 provides power to MR elements 104 and coil driver 110 provides current to coils 108. In response, coils 108 produce a magnetic field that can be detected by MR elements 104, which produce signal 104a representing the detected magnetic field.

As target 102 moves in relation to the magnetic field, its position and movement through the field changes the field. In response, signal 104a produced by MR elements 104 changes. Processor 112 receives signal 104a and processes the changes in (and/or the state of) the signal to determine position, movement, or other characteristics of target 102. In an embodiment, system 100 can detect movement or position of target 102 along axis 116. In other words, system 100 may detect the position of target 102 in proximity to MR elements 104 as target 102 moves toward or away from MR elements 104 and coils 108. System 102 may also be able to detect other types of position or movement of target 102.

Figure 2A:
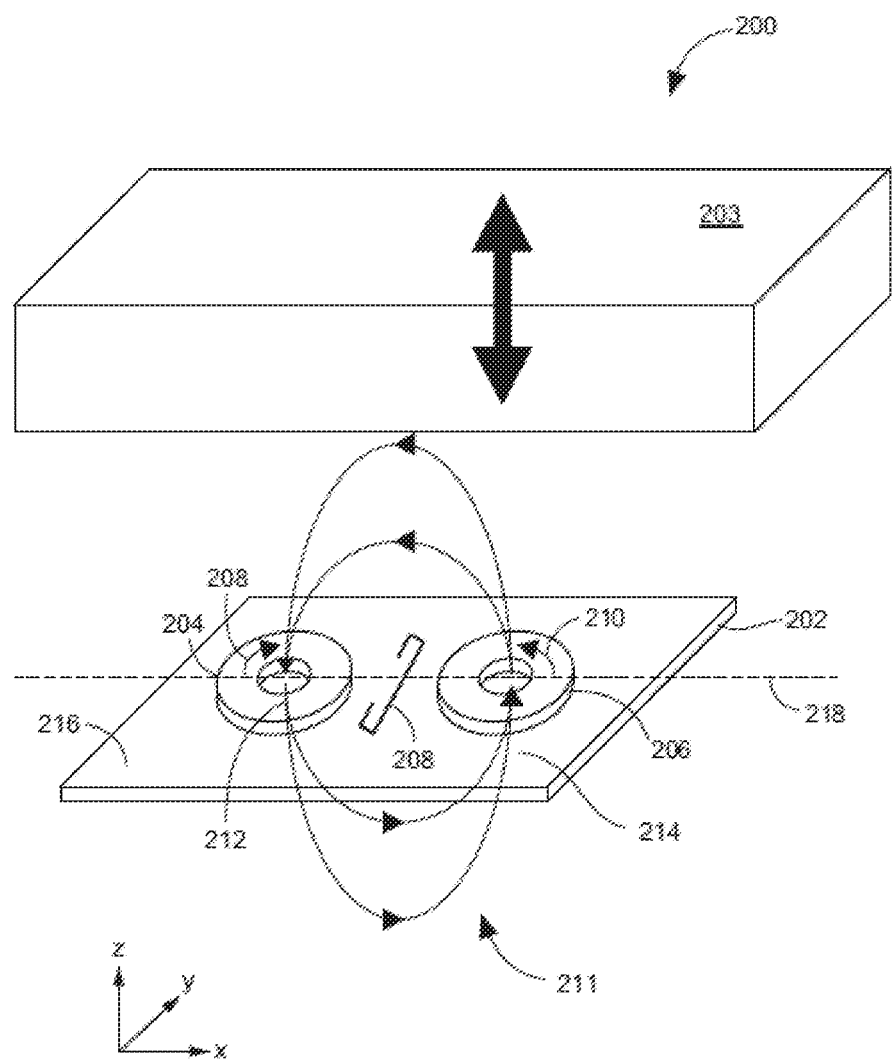
FIG. 2A is a perspective view of a magnetic field sensor with coil actuation.

Referring now to FIG. 2A, system 200 may be the same as or similar to system 100. Substrate 202 may be the same as or similar to substrate 114, and may support coil 204, coil 206, and MR element 208. Although one MR element is shown, MR element 208 may comprise two or more MR elements depending on the embodiment of system 200. Target 203 may be the same as or similar to target 102.

Although not shown, an MR driver circuit 106 may provide current to MR element 208 and coil driver circuit 110 may provide current to coils 204 and 206.

Coil 204 and 206 may be arranged so that the current flows through coils 204 and 206 in opposite directions, as shown by arrow 208 (indicating a clockwise current in coil 204) and arrow 210 (indicating a counterclockwise current in coil 206). As a result, coil 204 may produce a magnetic field having a magnetic moment in the negative Z direction (i.e. down, in FIG. 2), as indicated by arrow 212. Similarly, coil 206 may produce a magnetic field having a magnetic moment in the opposite direction, the positive Z direction, as indicated by arrow 214. An aggregate magnetic field 211 produced by both coils may have a shape similar to that shown by magnetic field lines 211. It will be appreciated that coils 204, 206 may be formed by a single coil structure respectively wound so that the current through the coils flows in opposite directions. Alternatively, coils 204, 206 may be formed by separate coil structures.

In an embodiment, MR element 208 may be placed between coils 204 and 206. In this arrangement, absent any other magnetic fields aside from those produced by coils 204 and 206, the net magnetic field at MR element 208 may be zero. For example, the negative Z component of the magnetic field produced by coil 204 may be canceled out by the positive Z component of the magnetic field produced by coil 206, and the negative X component of the magnetic field shown above substrate 202 may be canceled out by the positive X component of the magnetic field shown below substrate 202. In other embodiments, additional coils may be added to substrate 202 and arranged so that the net magnetic field at MR element 208 is substantially nil.

To achieve a substantially zero magnetic field at the location of MR element 208, coil 204 and coil 206 may be placed so that current through the coils flows in circular patterns substantially in the same plane. For example, the current through coil 204 and 206 is flowing in circular patterns through the coils. As shown, those circular patterns are substantially coplanar with each other, and with the top surface 216 of substrate 202.

As noted above, coil driver 110 may produce an alternating field. In this arrangement, the magnetic field shown by magnetic field lines 211 may change direction and magnitude over time. However, during these changes, the magnetic field at the location of MR element 208 may remain substantially nil.

In operation, as target 203 moves toward and away from MR element 208 (i.e. in the positive and negative Z direction), magnetic field 211 will cause eddy currents to flow within target 203. These eddy currents will create their own magnetic fields, which will produce a non-zero magnetic field in the plane of the MR element 208, which non-zero magnetic field can be sensed to detect the motion or position of target 203.

Figure 2B:
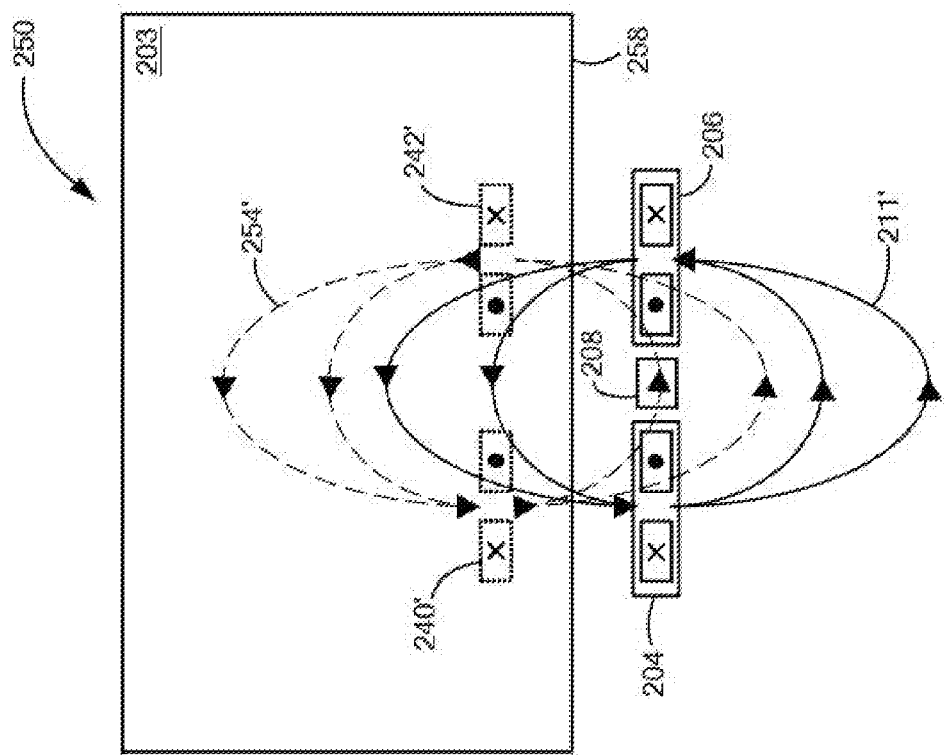
FIG. 2B is a block diagram of a magnetic field sensor with coil actuation detected a reflected field from a target.
Figure 2B:
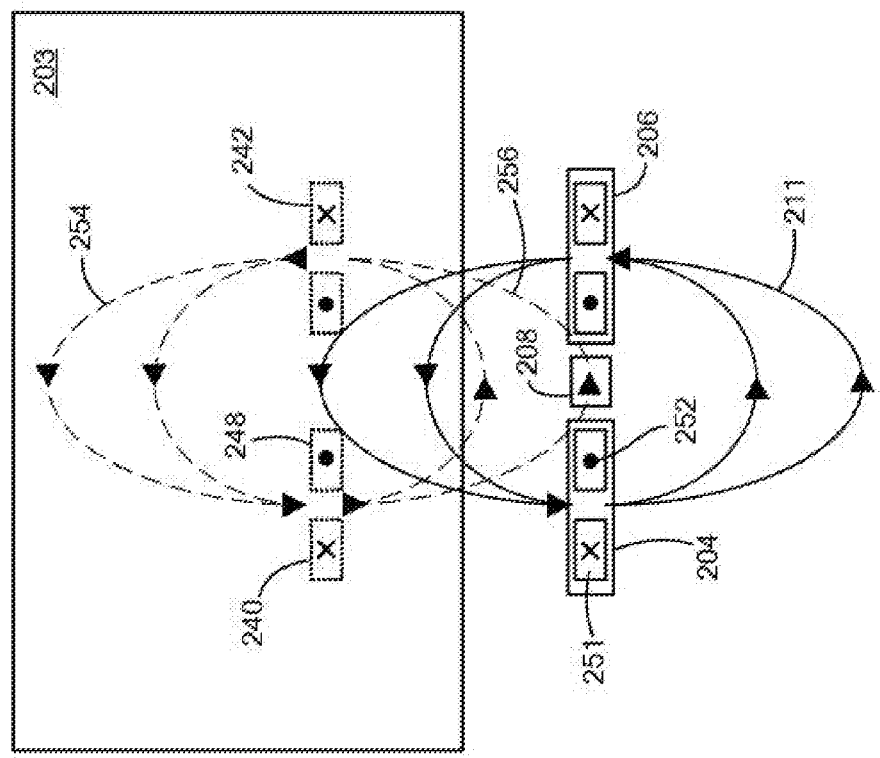

Referring to FIG. 2B, a cross-sectional view 250 of system 200, as viewed at line 218 in the Y direction, illustrates the eddy currents within target 203. The 'x' symbol represents a current flowing into the page and the symbol represents a current flowing out of the page. As noted above, the current through coils 204 and 206 may be an alternating current, which may result in an alternating strength of magnetic field 211. In embodiments, the phase of the alternating current through coil 204 matches the phase of the alternating current through coil 206 so that magnetic field 211 is an alternating or periodic field.

Alternating magnetic field 211 may produce reflected eddy currents 240 and 242 within magnetic or conductive target 203. Eddy currents 240 and 242 may be opposite in direction to the current flowing through coils 204 and 206, respectively. As shown, eddy current 240 flows out of the page and eddy current 248 flows into the page, while coil current 251 flows into the page and current 252 flows out of the page. Also, as shown, the direction of eddy current 242 is opposite the direction of the current through coil 206.

Eddy currents 240 and 242 form a reflected magnetic field 254 that has a direction opposite to magnetic field 211. As noted above, MR element 208 detects a net magnetic field of zero due to magnetic field 211. However, MR element 208 will detect a non-zero magnetic field in the presence of reflected magnetic field 256. As illustrated by magnetic field line 256, the value of reflected magnetic field 254 is non-zero at MR element 208.

As target 203 moves closer to coils 204 and 206, magnetic field 211 may produce stronger eddy currents in target 203. As a result, the strength of magnetic field 254 may change. In FIG. 2B, magnetic field 211' (in the right-hand panel of FIG. 2B) may represent a stronger magnetic field than magnetic field 211 due, for example, to the closer proximity of target 203 to coils 204 and 206. Thus, eddy currents 240' and 242' may be stronger currents than eddy currents 240 and 242, and magnetic field 254' may be stronger than magnetic field 254. This phenomenon may result in MR element 208 detecting a stronger magnetic field (i.e. magnetic field 254') when target 203 is closer to coils 204 and 206, and a weaker magnetic field (i.e. magnetic field 254) when target 203 is further away from coils 204 and 206.

Also, eddy currents 240' and 242' generally occur on or near the surface of target 203. Therefore, as target 203 moves closer to MR element 208, MR element 208 may experience a stronger magnetic field from the eddy currents because the source of the reflected magnetic field is closer to MR element 208. Note that, for ease of illustration, the eddy currents appear in the center of target 203 in the drawing. In an actual device, the eddy currents may occur at or near the surface or "skin" of target 203.

Figure 3:
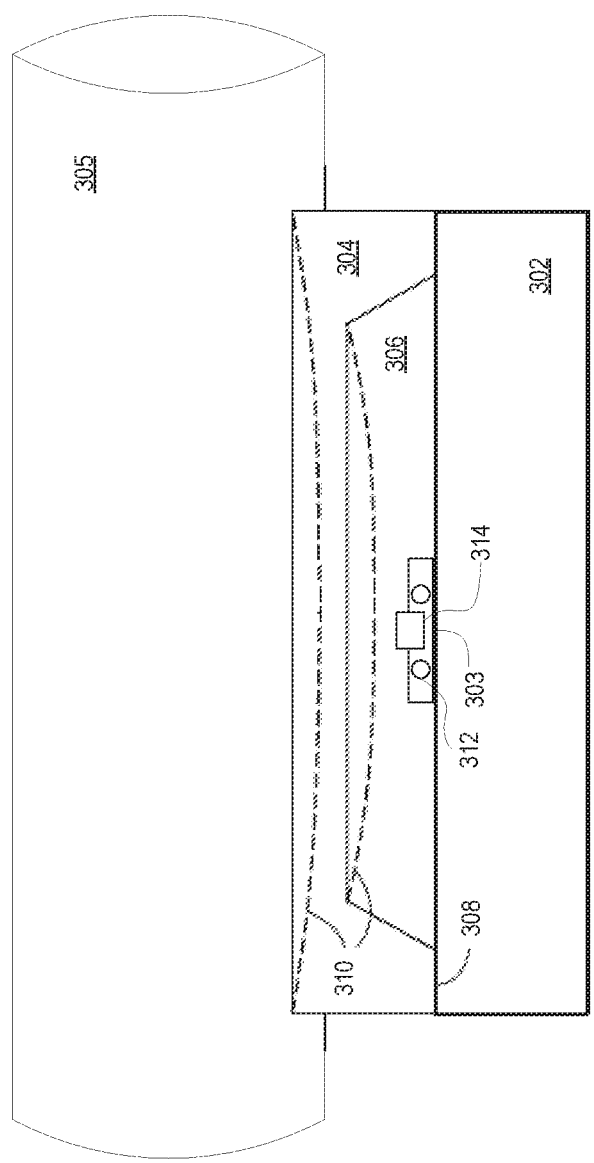
FIG. 3 is a block diagram of a pressure sensor utilizing a magnetic field sensor.

Referring also to FIG. 3, a pressure sensor 300 includes a first substrate 302 and a second substrate 304 attached to the first substrate 302. Substrates 302 and 304 may be formed from any type of material. In an embodiment, substrate 304 may be the wall (or attached to the wall) of a pipe 305 that contains a liquid or gas that is under pressure. Substrate 304 may comprise a conductive material such as copper or iron that allows eddy currents to form within substrate 304. The eddy currents formed in substrate 304 may produce a reflected magnetic field as described above.

Second substrate 304 may include a surface 308 and cavity 306 formed in the surface. Cavity 306 may be etched into the substrate. In embodiments, substrate 304 may be etched to form a thin portion that is thin enough to deflect (e.g. deform or bend) under pressure, as shown by dotted lines 310. The deformation may be an elastic deformation that allows the deformed portion to revert to its original shape in the absence of external pressure. MR elements supported by substrate 302 may detect (via a reflected magnetic field as describe above) the deformation of substrate 304. The detected deformation may be subsequently correlated to a pressure.

In embodiments, thin portion 304 may be a conductive material such as metal, a conductive ceramic, or a multilayered laminate of conductive and/or non-conductive materials. In other embodiments, thin portion 304 may comprise a non-conductive material such as silicon, glass, or non-conductive ceramic that has a conductive coating on its surface (e.g. the surface closes to magnetic field sensing elements 314. In this case, the eddy currents may be formed within the conductive coating.

Pressure sensor 300 may include a magnetic field sensor 303, which may be the same as or similar to system 100 and/or system 200 described above. Magnetic field sensor 303 may include one or more coils 312 that generate a magnetic field. The magnetic field generated by coils 312 may induce eddy currents to form in substrate 304. The reflected field generated by these eddy currents may be detected by magnetic field sensing elements 314, which generate output signals representing the detected, reflected magnetic field. Magnetic field sensor 303 may also include a processor circuit (not shown) that can receive the signals generated by magnetic field sensing elements 314 to determine the amount of deflection of substrate 304. The amount of deflection can then be correlated to a pressure within pipe 305.

Although pipe 305 is used as an example, any structure with an internal cavity filled with a vacuum or a pressurized gas or liquid can be used including, but not limited to, tubes, balloons, tires, altimeters, depth sensors, etc.

In embodiments, the MR elements on substrate 302 may be positioned so that one or more MR elements are adjacent to an edge (e.g. a non-deflecting portion) of cavity 306 and one or more MR elements are adjacent to the center (e.g. a deflecting portion) of cavity 306.

In embodiments, substrate 304 may be formed from a conductive material, for example copper, steel, aluminum, etc. Therefore, motion of a conductive deformable portion of substrate 304 caused by pressure or vacuum within pipe 305 can be detected. Alternatively, the substrate 304 may be formed by a non-conductive material such a crystalline structure like sapphire, non-conductive ceramic, glass, etc. The crystalline structure may be coated by a thick enough conductive material like copper so that eddy currents can form in the coating.

In embodiments, cavity 306 is evacuated during the manufacturing process to determine a reference pressure. In embodiments, the reference pressure is a vacuum or a pressure that is less than standard pressure (e.g. less than 100 kPa).

Figure 4A:
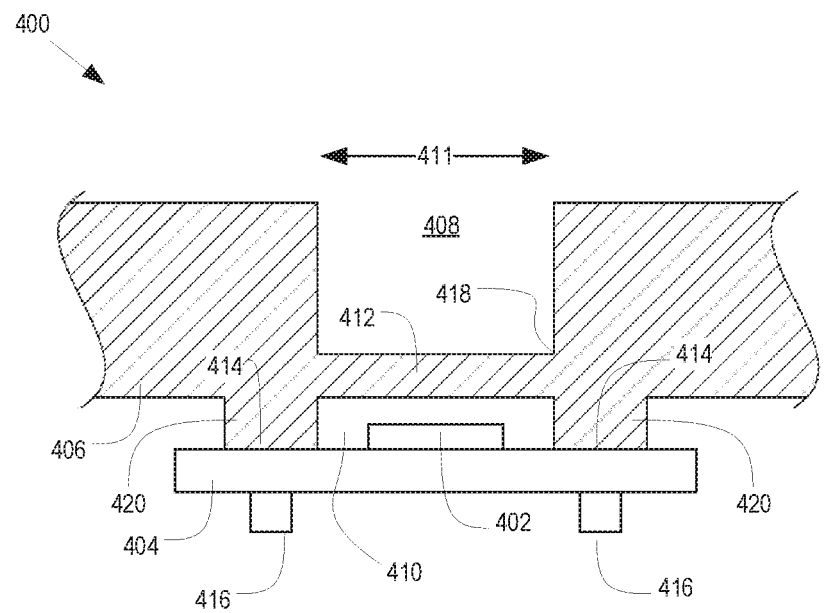
FIG. 4A, FIG. 4B, FIG. 4C, FIG. 4D, FIG. 4E, and FIG. 4F are block diagrams of pressure sensors utilizing magnetic field sensors.

Referring to FIG. 4A, another embodiment of a pressure sensor 400 includes a magnetic field sensor 402 supported by a substrate 404. Substrate 404 is coupled to a second substrate 406. Substrate 406 may be the wall of a pipe or other enclosed structure that has internal pressure. Thus, the area 408 may be a vacuum or a pressurized area. For example, area 408 may be a very low pressure, such as a vacuum on the order of 10^–6 Torr or lower up to pressures above standard atmospheric pressure.

Substrate 404 may act as a backing plate that holds magnetic field sensor 402 in place and forms one wall of cavity 410. In embodiments, substrate 404 may be formed from a non-conductive material such as plastic, a ceramic, or a crystalline material so that the coils of magnetic field sensor 402 do not induce eddy currents in substrate 404.

Substrate 406 may include a deflectable or deformable section 412 that is sufficiently thin so that it bends and deflects as the pressure in area 408 changes like substrate 304 in FIG. 3.

When joined, substrate 404 and substrate 406 may form a hollow cavity 410. Cavity 410 may be evacuated of gas or liquid or may be filled by a compressible gas having a calibrated pressure that allows substrate 406 to deflect toward or away from magnetic field sensor 408.

Area 408 may form a cavity on an inner surface of substrate 406. In embodiments, the cavity that forms area 408 and cavity 410 may have the same length 411.

Magnetic field sensor 402 may be positioned in cavity 410 so that it can produce eddy currents within substrate 406. As the pressure in area 408 changes, section 412 of substrate 406 may be deflected toward or away from magnetic field sensor 402. Magnetic field sensor 402 may detect the proximity of section 412, which can then be correlated to a pressure within area 402.

In embodiments, substrate 404 may be fastened to substrate 406 so that joints 414 form a gas-tight seal. Though not shown, gaskets may be positioned at joints 414 to produce the seal. Bolts 416 may thread through substrate 404 and into substrate 406 to fasten the substrates together tightly enough to form a gas-tight seal at joints 414. Additionally or alternatively, an adhesive or joint compound may be placed at joints 414. Other techniques such as soldering, brazing, may be used to form gas-tight joints 414. Seals such as glass metal seals or silicon-to-glass seals may be used to form gas-tight joints 414. Notwithstanding these examples, any fastener or fastening technique may be used to fasten substrate 404 to substrate 406 and form gas-tight joints 414.

Substrate 406 may be machined or molded to form thin section 412. In the embodiment shown in FIG. 4A, thin section 412 has square corners (e.g. corner 418). These may be formed by using machining techniques such as drilling or routing to form cavity 410 and section 412.

Substrate 406 also includes protrusions 420 that join to substrate 404. Protrusions 420 may form the sidewalls for cavity 410. These protrusions may also be machined and provide a support structure onto which substrate 404 can be attached.

Figure 4B:
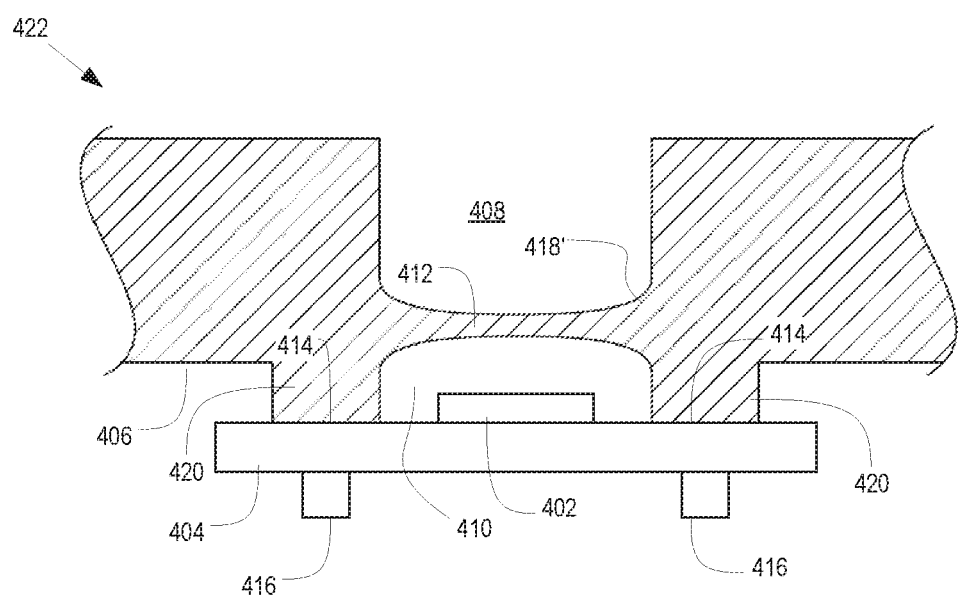

Referring to FIG. 4B, pressure sensor 422 may be the same as or similar to pressure sensor 400. As shown in FIG. 4B, section 412 may have rounded corners 418' rather than square corners. The rounded corners may provide additional protection from cracking, or brittle fracture, depending on the type of material used for substrate 406. Also, rounded corners 418' may be more easily formed from a molding or machining process than square corners. Of course, either square or rounded corners can be produced by machining or molding.

Figure 4C:
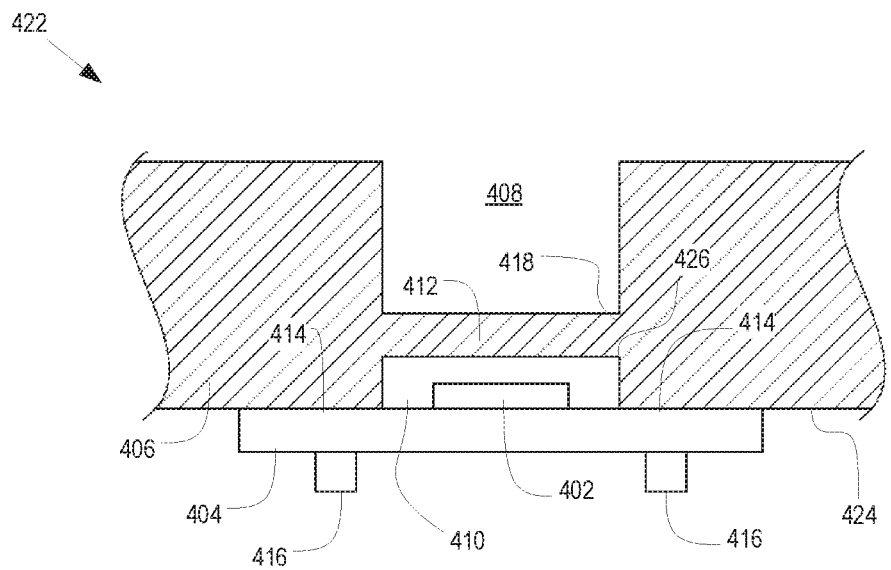

Referring to FIG. 4C, pressure sensor 424 may be the same as or similar to pressure sensor 400. However, as shown in FIG. 4C, substrate 406 may not include any protrusions 420. Instead, substrate 404 may form joints 414 directly on flush surface 424 of substrate 406. In this case, cavity 410 may be formed as a cavity or void within substrate 406.

Substrate 404 may be fastened to substrate 406 by bolts 416. To receive bolts 416, substrate 406 may have holes tapped directly into surface 424. In other embodiments, substrate 404 may be fastened to substrate 406 by an adhesive, gasket, bolt, metal seal, silicon-to-glass seal, brazing, soldering, fusion bonding, welding, or by any other fastening and/or sealing technique.

Cavity 410 in pressure sensor 424 may have squared corners 426. As described above, these corners may be produced by a machining or molding process, or any other process that can remove material from substrate 406 to form cavity 410 with square corners.

Figure 4D:
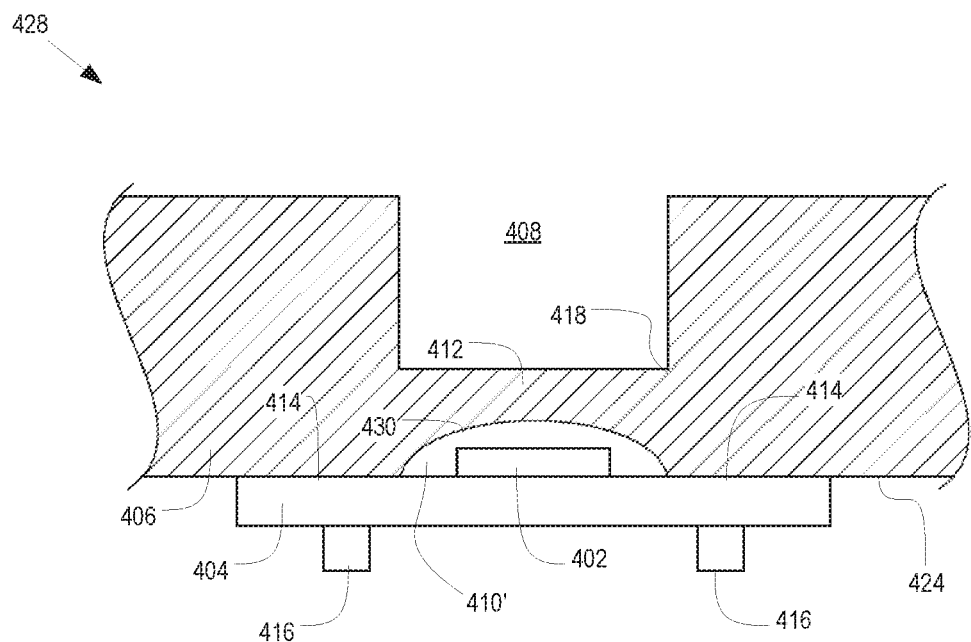

Referring to FIG. 4D, pressure sensor 428 may be the same as or similar to pressure sensor 400. As shown in FIG. 4D, cavity 410' may have rounded corners rather than square corners 426 of cavity 410. The rounded corners may provide additional protection from cracking, depending on the type of material used for substrate 406. Also, in certain manufacturing processes rounded corners may be more easily formed from a molding process than square corners. Of course, either square or rounded corners can be produced by machining or molding.

In embodiments, the surface 430 of cavity 410' may form a semicircle, a semi-ellipse, or other type of arc. Cavity 410' may be formed by machining or molding, or any other technique (such as etching) that can remove material from substrate 406 to form a rounded cavity 410'.

Figure 4E:
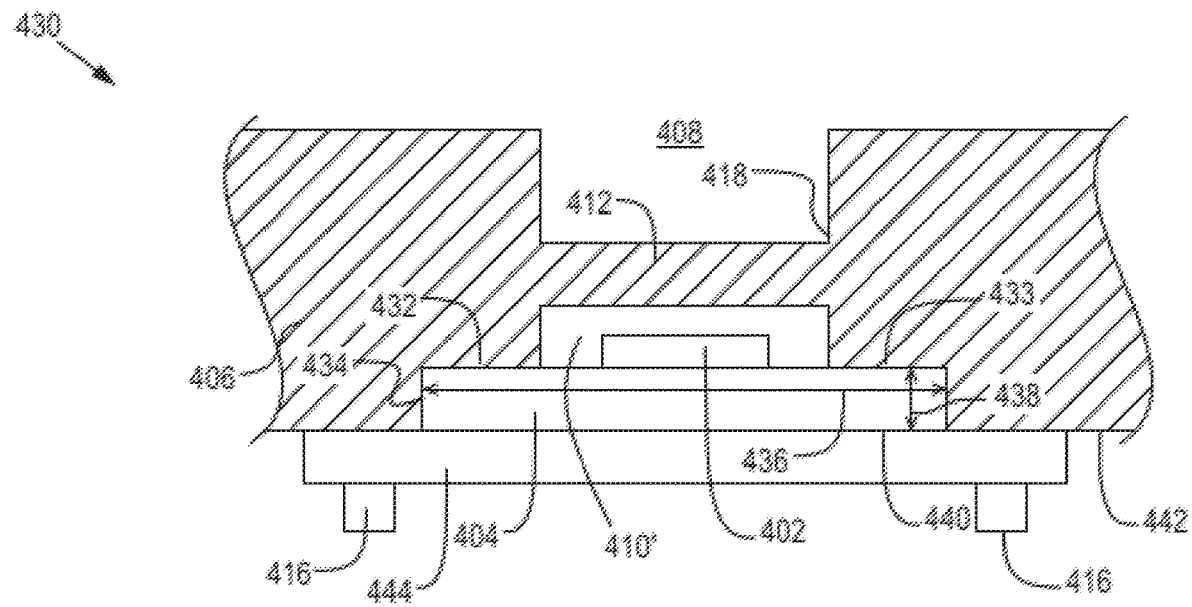

Referring to FIG. 4E, pressure sensor 430 may be the same as or similar to pressure sensor 400. However, cavity 410' of pressure sensor 430 may have a symmetrical stepped shape that includes an additional step 432 and 433 or ledge on either side of cavity 410'. Steps 432 and 433 may create a socket section 434 to accept substrate 404. Socket section 434 may have a length 436, width 438, and depth (into and out of the page) that is substantially the same as the length, width, and depth of substrate 404 so that, when substrate 404 is positioned within socket section 434, surface 440 of substrate 404 is flush with surface 442 of substrate 406.

Pressure sensor 430 may also include a backing plate 444 that is fastened to substrate 406, for example by bolts 416 or any other type of fastener including, but not limited to, the fasteners and seals mentioned above. Backing plate 444 may form one wall of cavity 410'. As shown, bolts 416 may pass through backing plate 444 into substrate 406 to fasten backing plate 444 to substrate 406. Substrate 404 may be held in place between step 432 and backing plate 444. In other embodiments, bolts 416 may be positioned so they pass through both backing plate 444 and substrate 404 into substrate 406.

Substrate 404 may be fastened to backing plate 404 by screws, bolts, an adhesive, or any other type of fastening technique. In other embodiments, substrate 404 may not be fastened to either substrate 404 or 406, but rather may be held in place by pressure between backing plate 444 and substrate 406 from, for example, bolts 416. In other embodiments, substrate 404 may be held in place by a combination of the pressure between backing plate 444 and substrate 406, and by a fastener or adhesive.

Figure 4F:
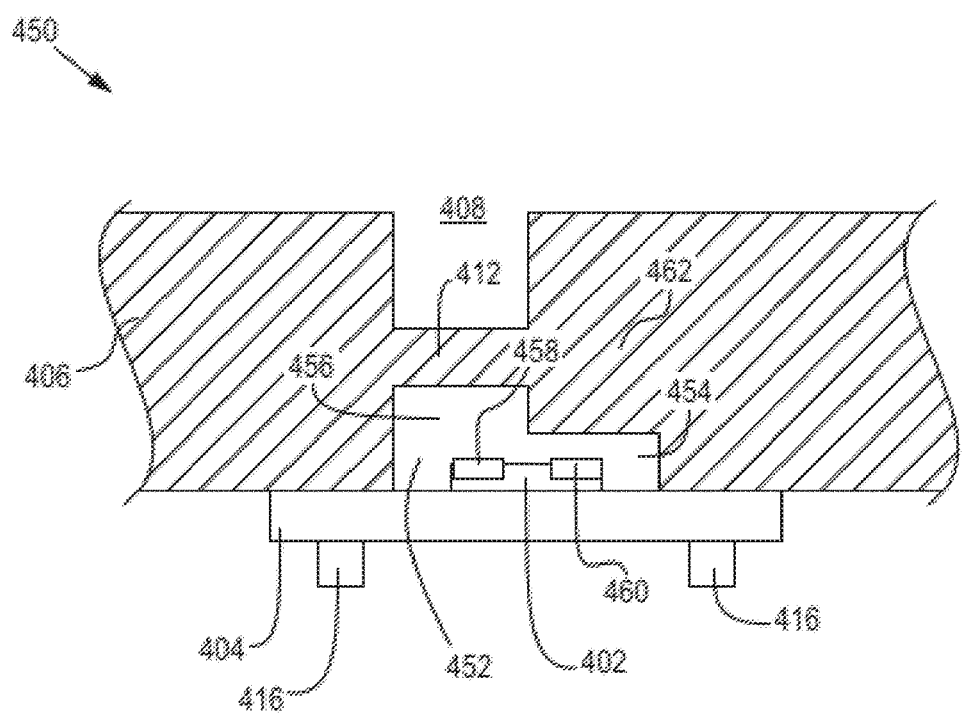

Referring to FIG. 4F, pressure sensor 450 may be the same as or similar to pressure sensor 400. However, cavity 452 of pressure sensor 450 may have an asymmetrical stepped shape, which may result in cavity 452 having a relative shallow portion 454 and a relatively deep portion 456. As a result, thin section 412 (which may deflect in response to the pressure in area 408) may be adjacent to the deep portion 456 of cavity 452. The section of substrate 406 that is adjacent to the shallow portion 454 of cavity 452 may be relatively thick and, as a result, may not defect in response to changes in pressure in area 408.

Magnetic field sensor 402 may include two or more magnetic field sensing elements 458 and 460. Magnetic field sensing elements 458 and 460 may each be a single magnetic field sensing element or a plurality of magnetic field sensing elements. In some embodiments, each magnetic field sensing element 458 and 460 may be a bridge circuit of magnetic field sensing elements.

Magnetic field sensor 402 may be positioned so that magnetic field sensing element 460 is within the relatively shallow portion 454 and magnetic field sensing element 458 is within the relatively shallow portion 456 of cavity 452. As a result, magnetic field sensing element 458 may be adjacent to the thin, deflectable section 412 of substrate 406 and magnetic field sensing element 460 may be adjacent to a thick portion of substrate 406 that does not deflect in response to changes in pressure in area 408.

As the pressure changes in area 408 and thin section 412 deflects, magnetic field sensor 458 may detect changes in the reflected magnetic field. Conversely, because thick section 462 does not deflect in response to pressure changes, magnetic field sensing element 460 may not detect any changes in the magnetic field reflected from thick section 462. In various embodiments, the signal produced by magnetic field sensor 458 may be used to determine the pressure in area 408 and the signal produced by magnetic field sensor 460 may be used as a reference or calibration signal.

Additional examples of pressure sensors that use eddy currents to detect proximity of a deflected substrate can be found in U.S. patent application Ser. No. 15/606,362 (filed May 26, 2017), which is incorporated here by reference in its entirety. U.S. Pat. No. 10,145,908 (filed Jul. 19, 2013) and U.S. Pat. No. 9,817,078 (filed May 10, 2012) are also incorporated here by reference in their entirety.

Having described various embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims. All references cited herein are hereby incorporated herein by reference in their entirety.

The invention claimed is:

1. A pressure sensor comprising:
   a substrate having a cavity and at least a portion that is conductive and that is configured to be deformed by a pressure differential across the conductive substrate; and
   a magnetic field sensor comprising:
   at least one coil responsive to a changing coil drive signal and positioned proximate to the portion of the substrate so that a magnetic field produced by the at least one coil induces eddy currents in the portion of the substrate that generate a reflected magnetic field; and
   at least one magnetic field sensing element disposed proximate to the at least one coil and to the portion of the substrate, and configured to generate a magnetic field signal in response to the reflected magnetic field;
   wherein the magnetic field sensor is positioned so that deformation of the portion of the substrate causes a distance between the portion of the substrate and the at least one magnetic field sensing element to change.

2. The pressure sensor of claim 1 wherein a strength of the reflected magnetic field is responsive to the distance between the portion of the substrate and the magnetic field sensor.

3. The pressure sensor of claim 1 wherein a value of the magnetic field signal is responsive to the distance between the portion of the substrate and the magnetic field sensor.

4. The pressure sensor of claim 1 wherein the cavity is substantially rectangular and has squared corners and/or rounded corners.

5. The pressure sensor of claim 1 wherein the conductive substrate comprises mounting posts to mount a second substrate and/or a backing plate that supports a second substrate.

6. The pressure sensor of claim 1 wherein the at least one magnetic field sensing element comprises a magnetoresistance element, a Hall effect element, or both.

7. The pressure sensor of claim 1 wherein the substrate comprises a conductive material.

8. The pressure sensor of claim 1 wherein the substrate comprises a conductive coating.

9. The pressure sensor of claim 1 wherein the changing coil drive signal is an AC drive signal.

10. The pressure sensor of claim 1 further comprising a second substrate that supports the magnetic field sensor.

11. The pressure sensor of claim 10 wherein the second substrate is a printed circuit board, the magnetic field sensor is an integrated circuit, and the printed circuit board supports the integrated circuit.

12. The pressure sensor of claim 10 further comprising a backing plate physically coupled to the conductive substrate to form one wall of the cavity, wherein the second substrate is supported by the backing plate.

13. The pressure sensor of claim 1 wherein the conductive substrate forms a pipe and the cavity is formed on an inner surface of the pipe.

14. The pressure sensor of claim 13 further comprising a second cavity formed on an outer surface of the pipe and positioned so that the cavity and the second cavity form the portion.

15. The pressure sensor of claim 13 wherein a pressure within the pipe causes the portion to deform and the distance between the portion and the magnetic field sensor to change.

16. The pressure sensor of claim 1 further comprising a second cavity, wherein the cavity and the second cavity are positioned on opposite sides of the conductive substrate, and the portion is formed between the cavity and the second cavity.

17. The pressure sensor of claim 16 wherein the second cavity is substantially rectangular in shape and has squared corners and/or rounded corners.

18. The pressure sensor of claim 16 wherein the cavity and the second cavity have substantially the same length.

19. The pressure sensor of claim 16 wherein the second cavity is a rounded hollow in the conductive substrate.

20. The pressure sensor of claim 16 wherein the second cavity has a stepped shape.

21. The pressure sensor of claim 20 wherein:
the stepped shape is symmetric;
the stepped shape forms a deep portion and a shallow portion;
the shallow portion is configured to engage a second substrate that supports the magnetic field sensor; and
the second substrate is positioned so that the magnetic field sensor is positioned in the deep portion.

22. The pressure sensor of claim 20 wherein:
the stepped shape is asymmetric;
the stepped shape forms:
a deep portion adjacent to the, deformable portion of the conductive substrate; and
and a shallow portion;
the magnetic field sensor comprises at least two magnetic field sensing elements; and
the magnetic field sensor is positioned so that a first magnetic field sensing element is positioned in the shallow portion and a second magnetic field sensing element is positioned in the deep portion.

23. The pressure sensor of claim 22 wherein the first magnetic field sensing element produces a reference signal and the second magnetic field sensing element produces the magnetic field signal.

* * * * *

UNITED STATES PATENT AND TRADEMARK OFFICE
CERTIFICATE OF CORRECTION

PATENT NO. : 11,061,084 B2
APPLICATION NO. : 16/295131
DATED : July 13, 2021
INVENTOR(S) : Bryan Cadugan et al.

It is certified that error appears in the above-identified patent and that said Letters Patent is hereby corrected as shown below:

In the Specification

Column 3, Line 2 delete "detected" and replace with --detecting--.

Column 4, Line 13 delete "by substrate" and replace with --by a substrate--.

Column 4, Line 26 delete ", n" and replace with --, an--.

Column 4, Line 35 delete ". Processor 100" and replace with --. Processor 112--.

Column 4, Line 61 delete ". System 102" and replace with --. System 100--.

Column 5, Line 6 delete "Coil" and replace with --Coils--.

Column 5, Lines 60-61 delete "the symbol" and replace with --the '•' symbol--.

Column 7, Line 2 delete "closes" and replace with --closest--.

Column 7, Line 3 delete "314." and replace with --314).--.

Column 7, Line 34 delete "such a" and replace with --such as a--.

Column 7, Line 67 delete "sensor 408." and replace with --sensor 402.--.

Column 8, Line 10 delete "area 402." and replace with --area 408.--.

Column 8, Line 44 delete "sensor 424" and replace with --sensor 422--.

Column 8, Line 58 delete "sensor 424" and replace with --sensor 422--.

Signed and Sealed this
Fifth Day of July, 2022

*Katherine Kelly Vidal*
Katherine Kelly Vidal
*Director of the United States Patent and Trademark Office*

CERTIFICATE OF CORRECTION (continued)
U.S. Pat. No. 11,061,084 B2

Column 9, Line 34 delete "plate 404" and replace with --plate 444--.

Column 9, Line 47 delete "relative" and replace with --relatively--.

Column 9, Line 52 delete "defect" and replace with --deflect--.

Column 10, Line 25 delete "that that" and replace with --that the--.